United States Patent
Sakata et al.

(10) Patent No.: US 11,227,784 B2
(45) Date of Patent: Jan. 18, 2022

(54) THIN PLATE SUBSTRATE-HOLDING DEVICE AND TRANSFER ROBOT PROVIDED WITH THIS HOLDING DEVICE

(71) Applicant: Rorze Corporation, Hiroshima (JP)

(72) Inventors: Katsunori Sakata, Fukuyama (JP); Yasuhisa Sato, Ibara (JP)

(73) Assignee: Rorze Corporation

( * ) Notice: Subject to any disclaimer, the term of this patent is extended or adjusted under 35 U.S.C. 154(b) by 0 days.

(21) Appl. No.: 16/966,888

(22) PCT Filed: Jan. 17, 2019

(86) PCT No.: PCT/JP2019/001256
§ 371 (c)(1),
(2) Date: Aug. 1, 2020

(87) PCT Pub. No.: WO2019/155842
PCT Pub. Date: Aug. 15, 2019

(65) Prior Publication Data
US 2021/0050242 A1 Feb. 18, 2021

(30) Foreign Application Priority Data
Feb. 6, 2018 (JP) .............................. JP2018-018797

(51) Int. Cl.
*H01L 21/677* (2006.01)
*B65G 47/91* (2006.01)
(Continued)

(52) U.S. Cl.
CPC ........ *H01L 21/67766* (2013.01); *B65G 47/91* (2013.01); *H01L 21/67778* (2013.01);
(Continued)

(58) Field of Classification Search
None
See application file for complete search history.

(56) References Cited

U.S. PATENT DOCUMENTS

| 2002/0057955 A1* | 5/2002 | Tsubota | ..................... B25J 9/06 414/1 |
| 2010/0290886 A1* | 11/2010 | Hashimoto | .......... B25J 15/0014 414/800 |
| 2015/0170945 A1* | 6/2015 | Segawa | ............. H01L 21/67772 414/217 |

FOREIGN PATENT DOCUMENTS

| JP | 2000-040730 | 2/2000 |
| JP | 2009-032877 | 2/2009 |

(Continued)

OTHER PUBLICATIONS

Translation by Google Translate of the JP Foreign opinion filed on Aug. 1, 2020 in the current application. Accessed Apr. 28, 2021. (Year: 2021).*

(Continued)

*Primary Examiner* — Gerald McClain
(74) *Attorney, Agent, or Firm* — Merek, Blackmon & Voorhees, LLC

(57) ABSTRACT

Provided is a holding device 45 capable of holding securely and transporting a thin plate-shaped substrate for which surface processing has been completed without causing a natural oxide film to form on the surface to be processed thereof. This holding device 45 comprises a holding member 47 for holding the thin plate-shaped substrate, a purge plate 46 having formed therein a flow path 52 for the purpose of flowing therethrough an inert gas, and a piping member for connecting an inert gas supply source to the flow path 52. The purge plate 46 is equipped with discharged ports 51, which communicate with the flow path 52 and are provided on a surface facing the surface to be processed of the thin plate-shaped substrate held by the holding member 47, for the purpose of discharging the inert gas onto the processing surface of the thin plate-shaped substrate. In addition, the holding device 45 is equipped with a raising and lowering (Continued)

mechanism 48 that cause the holding member 47 and the purge plate 46 to be raised and lowered relative to each other.

23 Claims, 20 Drawing Sheets

(51) Int. Cl.
*H01L 21/683* (2006.01)
*H01L 21/67* (2006.01)

(52) U.S. Cl.
CPC .... *H01L 21/6838* (2013.01); *H01L 21/67017* (2013.01); *H01L 21/67769* (2013.01); *H01L 21/67772* (2013.01)

(56) References Cited

FOREIGN PATENT DOCUMENTS

| | | | | |
|---|---|---|---|---|
| JP | 2009-170740 | | 7/2009 | |
| JP | 2009170740 A | * | 7/2009 | |
| JP | 5448000 | | 3/2014 | |
| JP | 2015-95526 | | 5/2015 | |
| JP | 2015-146349 | | 8/2015 | |
| WO | WO2013/179904 | | 12/2013 | |
| WO | WO-2013179904 A1 | * | 12/2013 | ....... H01L 21/67766 |

OTHER PUBLICATIONS

International Search Report dated Apr. 16, 2019 issued in connection with International Application No. PCT/JP2019/001256, 2 pages.

* cited by examiner

THIN PLATE SUBSTRATE-HOLDING DEVICE AND TRANSFER ROBOT PROVIDED WITH THIS HOLDING DEVICE

FIELD OF THE INVENTION

The present invention relates to a thin plate-shaped substrate holding device and a transport robot provided with the holding device, the thin plate-shaped substrate holding device for removing a substance remaining on a surface of a thin plate-shaped substrate by supplying inert gas on a surface to be processed of the thin plate-shaped substrate held thereby in a transport apparatus for transporting a thin plate-shaped substrate such as a semiconductor wafer, liquid crystal display panel, organic electroluminescence display panel, or solar cell panel.

BACKGROUND OF THE INVENTION

Conventionally, in an EFEM (Equipment Front End Module) for transferring a thin plate-shaped substrate by being connected to a processor performing various processes such as film forming or etching on a surface of the thin plate-shaped substrate, a space called a mini-environment space for maintaining a device inside atmosphere to which the thin plate-shaped substrate is exposed in high cleanliness has been formed in order to prevent floating dust in the air from adhering on the thin plate-shaped substrate. The mini-environment space is a space surrounded by an FFU (Fan Filter Unit), side walls and an air-flowable floor, and the atmosphere in the space is cleaned by filling an air cleaned by the FFU therein. Further, dust generated in the space is discharged outside the space with an air-flow of the clean air because the filled clean air is discharged outside the space through the air-flowable floor. According to this, the space where the substrate exists can be maintained in high cleanliness at relatively low cost.

However, recently, as miniaturization of circuit line widths progresses rapidly, problems that cannot be addressed only by high-cleaning purification based on the conventional mini-environment method are emerging. In particular, there is a problem that the surface of the thin plate-shaped substrate which has been surface-processed by the processor and transported to the closed container reacts with oxygen and moisture contained in the air in the mini-environment space to form a natural oxide film Due to the presence of the oxide film, a circuit to be formed on the surface of the thin plate-shaped substrate is not sufficiently formed, and as a result, a problem occurs that a desired operating characteristic cannot be secured. In addition, chemical substances contained in the reaction gas used in the processor are carried into the closed container in a state of being attached onto the thin plate-shaped substrate to contaminate the thin plate-shaped substrate in the closed container. This has an adverse effect on the processing steps of the above, and causes the deterioration of the yield.

In order to solve the above-mentioned problems, atmosphere replacement apparatuses have been considered to prevent an oxidation on the surface of the thin plate-shaped substrate contained in the closed container by removing the air and contaminants entering the closed container by an air-flow of inert gas, and then filling the inside of the closed container with the inert gas. The patent literature 1 discloses an apparatus for removing contaminants adhered on the surface of semiconductor wafer and replacing the atmosphere inside a FOUP (Front Opening Unified Pod), which is one of closed containers, with an inert gas atmosphere by supplying the inert gas from a purge plate provided to be movable back and forth to the FOUP inside the FOUP. See FIG. 1. An element for controlling the ejecting force of the inert gas is provided inside the purge plate to supply the inert gas as a laminar flow. According to this, it is possible to prevent the progress of oxidation on the surface of the semiconductor wafer without adhering dust on the thin plate-shaped substrate contained in the FOUP. However, in the present when miniaturization has advanced to a high degree, it is insufficient only by preventing the oxidation on the surface of the thin plate-shaped substrate contained in the FOUP, and it is required to prevent the oxidation while transporting the thin plate-shaped substrate from the processing apparatus with vacuum atmosphere to the inside of the FOUP The patent literature 2 is to respond to such the request, an apparatus is so constructed that a passage is provided near the mini-environment space to generate a falling current of the inert gas in the mini-environment and the inert gas is circulated by the passage. See FIG. 2. According to this construction, the falling current of the inert gas supplied from the FFU is sucked from a gas suction opening disposed in a floor surface, and thereafter, being moved up to the FFU through the passage to be supplied into the mini-environment space again According to this, the whole mini-environment space is filled with the inert gas, and therefore, the thin plate-shaped substrate is no longer exposed to the atmosphere when it passes through the mini-environment space.

PRIOR ART

Patent Literature

Patent literature 1: Japanese Patent No. 5448000
Patent literature 2: Japanese Patent Laid Open Publication No. 2015-146349

DISCLOSURE OF THE INVENTION

Problems to be Solved by the Invention

However, the construction described in the patent literature 2 causes various problems. First, a large quantity of inert gas is necessary to replace the inside of the mini-environment space with the inert gas, thereby increasing the production cost of semiconductors. In addition, in case of circulating the inert gas inside the mini-environment space, not only the inert gas but also components of reactant gas brought into the mini-environment space by being remained on surface of the thin plate-shaped substrate circulate through an apparatus, and therefore, new contaminant-treating means such as a chemical filter and so on need to be provided in order to remove the remained reactant gas. Besides, this chemical filter needs to be periodically exchange in order to maintain a high purifying degree, which also increases the cost. Further, a driving mechanism such as a transport robot is disposed in the mini-environment space, and an inert gas warmed by heat generated in the driving mechanism circulates so that the temperature in the space rises above a predetermined temperature. Thus, there is a possibility of causing troubles such as malfunctions in electric components and the like, so cooling means for cooling the circulating inert gas needs to be provided. Furthermore, because a down flow of the inert gas supplied from the FFU into the mini-environment space has a too low speed, there is a problem that components of the inert gas remained in details of patterns which are formed on the thin plate-shaped substrate cannot be removed.

The present invention is devised to solve the above-mentioned problems, and aims to provide a holding device capable of transporting the thin plate-shaped substrate without exposing the surface of the thin plate-shaped substrate to oxidizing atmospheres and a holding device equipped transport robot at a cheap price.

Means to Solve the Problem

The thin plate-shaped substrate holding device claimed in claim 1 of the present invention is characterized by having a purge plate having formed therein a flow path for the purpose of following therethrough an inert gas, a piping member for connecting an inert gas supply source to the flow path, discharge ports which communicate with the flow path and are provided on a surface facing the surface to be processed of the thin plate-shaped substrate held by the holding device, for the purpose of discharging the inert gas onto the processing surface of the thin plate-shaped substrate, a holding member which is disposed at a position facing the purge plate for the purpose of holding the thin plate-shaped substrate, and a first raising and lowering mechanism for moving the holding member up and down to the purge plate.

According to the above configuration, the thin plate-shaped substrate holding device can hold the thin plate-shaped substrate with the holding member and can discharge the inert gas toward the surface to be processed of the held thin plate-shaped substrate. According to this, the components of the reactive gas remained on the surface to be processed of the thin plate-shaped substrate after surface-processing are removed by a discharge of the inert gas. In addition, the inert gas airflow toward the outside prevents the atmosphere from entering a space formed between the thin plate-shaped substrate and the purge plate during transporting so as to solve a problem of natural oxide film formation. Further, the holding member is moved up and down by the first raising and lowering mechanism so as to perform reserving operation of the thin plate-shaped substrate by the operation of the first raising and lowering mechanism.

In addition, the thin plate-shaped substrate holding device claimed in claim 2 of the present invention is characterized by having a purge plate having formed therein a flow path for the purpose of following therethrough an inert gas, a piping member for connecting an inert gas supply source to the flow path, discharge ports which communicate with the flow path and are provided on a surface facing the surface to be processed of the thin plate-shaped substrate held by the holding device, for the purpose of discharging the inert gas onto the processing surface of the thin plate-shaped substrate, a holding member which is disposed at a position facing the purge plate for the purpose of holding the thin plate-shaped substrate, and a second raising and lowering mechanism for moving the holding member up and down to the purge plate. With the above configuration, since the purge plate is moved up and down by the second raising and lowering mechanism, the raising and lowering mechanism does not need to move the holding member having a complicated structure up and down. Thereby, the raising and lowering mechanism can be reduced in size and weight. Further, the holding member may be configured to suck and hold the thin plate-shaped substrate from below, or may be configured to clamp the periphery of the thin plate-shaped substrate.

Further, the thin plate-shaped substrate holding device claimed in claim 3 of the present invention is characterized by having a purge plate having formed therein a flow path for the purpose of following therethrough an inert gas, a piping member for connecting an inert gas supply source to the flow path, discharge ports which communicate with the flow path and are provided on a surface facing the surface to be processed of the thin plate-shaped substrate held by the holding device, for the purpose of discharging the inert gas onto the processing surface of the thin plate-shaped substrate, a holding member which is disposed at a position facing the purge plate for the purpose of holding the thin plate-shaped substrate, and a third raising and lowering mechanism for moving the holding member up and down to the purge plate. Besides, the third raising and lowering mechanism may be configured to move the purge plate and the holding member up and down separately, or may be configured to move up and down at the same time.

Moreover, it is characterized that a plurality of discharging ports are provided on the purge plate and at least a part of them is disposed correspondent to the position which the holding member is located. According to the configuration, discharging the inert gas toward the holding member without holding the thin plate-shaped substrate enables to remove contaminants such as dust and reactive gas particulates attached on the holding member from the holding member, thereby enabling to prevent contaminants from transferring on a surface of a new thin plate-shaped substrate. In addition, at least some of the plurality of discharging ports may be provided so as to be inclined toward the outside of the thin plate-shaped substrate being held. The discharging ports are provided so as to be inclined outward from the center of the held thin plate-shaped substrate to promote the outflow of the inert gas to the outside by flowing out the inert gas toward an outer of the thin plate-shaped substrate, thereby enabling to remove the contaminants remaining on the surface to be processed of the thin plate-shaped substrate in a shorter time.

Furthermore, the thin plate-shaped substrate holding device of the present invention can be also mounted on a thin plate-shaped substrate transport robot including an reciprocating mechanism for moving the thin plate-shaped substrate holding device back and forth, a turning mechanism for turning the reciprocating mechanism in a horizontal plane, and a raising and lowering mechanism for moving the reciprocating mechanism up and down. According to this, the thin plate-shaped substrate can be transported to a predetermined position while replacing the surface to be processed of the thin plate-shaped substrate with the inert gas.

Further, the thin plate-shaped substrate transporting apparatus of the present invention is characterized by including a transport space in which the thin plate-shaped substrate transport robot is disposed, a transport space forming member for forming the transport space, a sealed container opening and closing device fixed on the space forming member to open and close a sealed container in which the thin plate-shaped substrate is included by placing the container at a predetermined position, and an FFU fixed to the upper part of the transport space forming member to supply clean air as a downflow to the transport space. Besides, the thin plate-shaped substrate can be transported without being exposed to the atmosphere by adopting a configuration in which the inside of the sealed container can be replaced with a predetermined atmosphere in the sealed container opening and closing device, thereby enabling to prevent the natural oxide film from being formed on the surface to be processed of the thin plate-shaped substrate at a lower cost than a case in which the entire transport space is made an inert gas atmosphere.

Effects of Invention

According to the present invention described above, the thin plate-shaped substrate which the processing is concluded can be transported in a state where an atmosphere of the surface to be processed is locally replaced. According to this, an atmosphere of the entire space in which the thin plate-shaped substrate is transported does not have to be replaced, thereby contributing to cost reduction.

PREFERRED EMBODIMENT OF THE INVENTION

Figure 1:
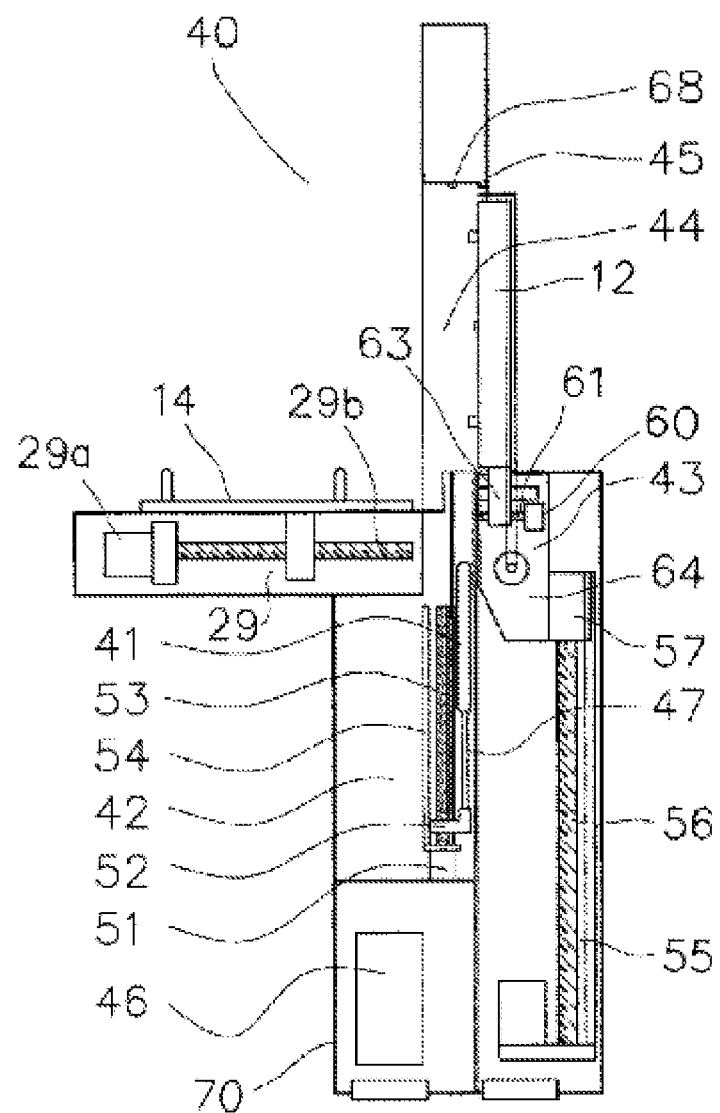
FIG. 1 is a cross-sectional view showing a conventional apparatus for replacing an atmosphere in the FOUP.
Figure 2:
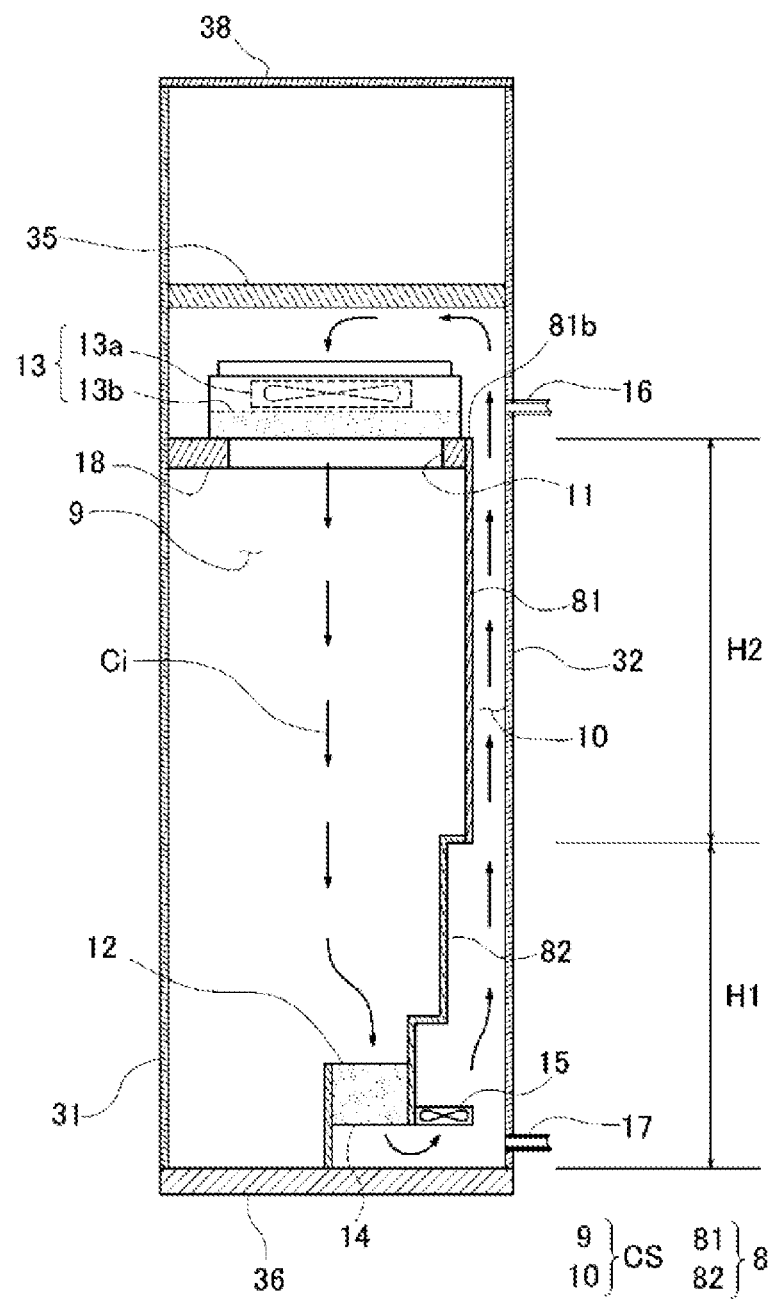
FIG. 2 is a cross-sectional view showing a conventional apparatus for replacing an atmosphere in the mini-environment space.
Figure 3:
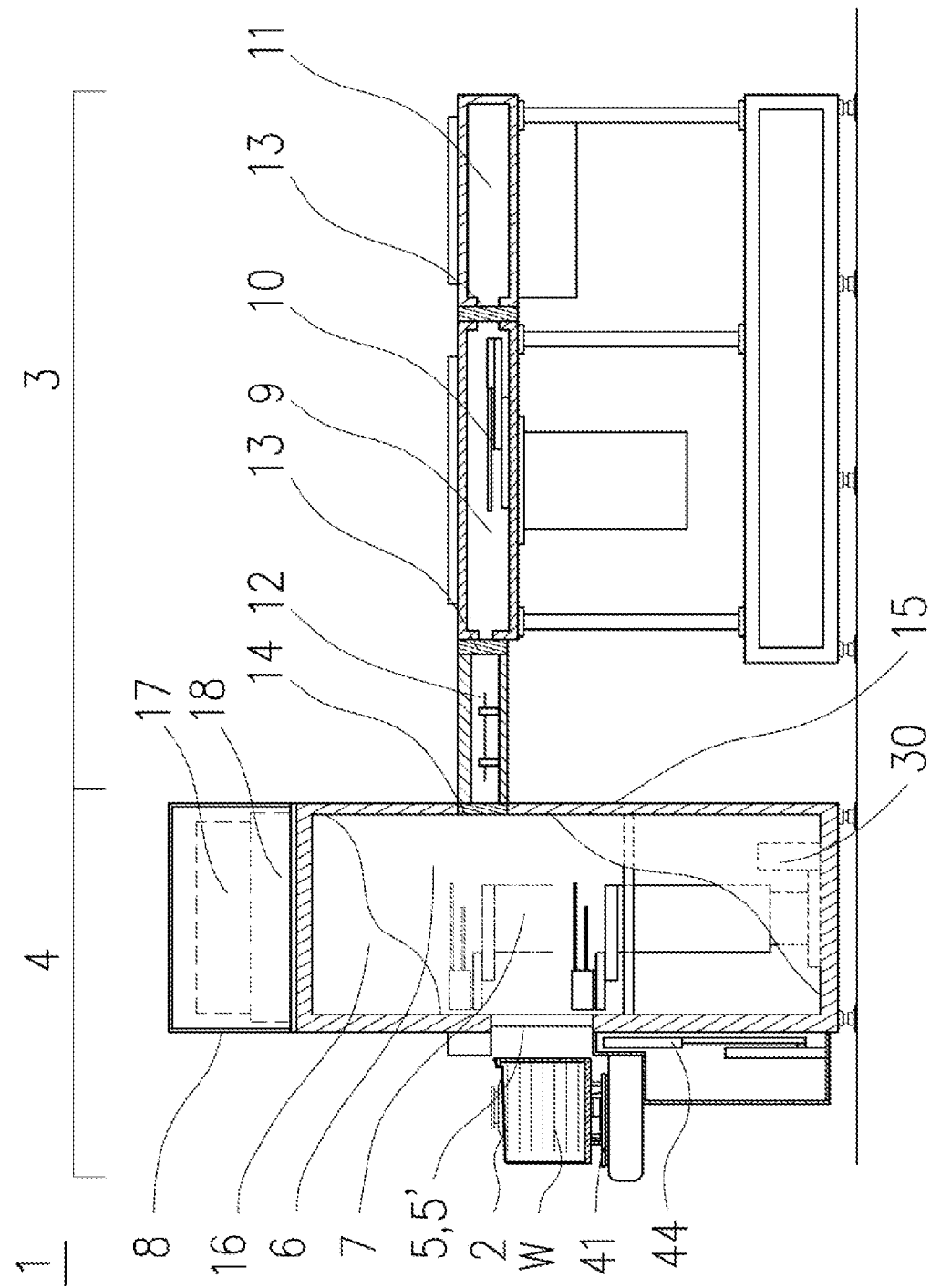
FIG. 3 is a cross-sectional view showing a processing system.
Figure 4:
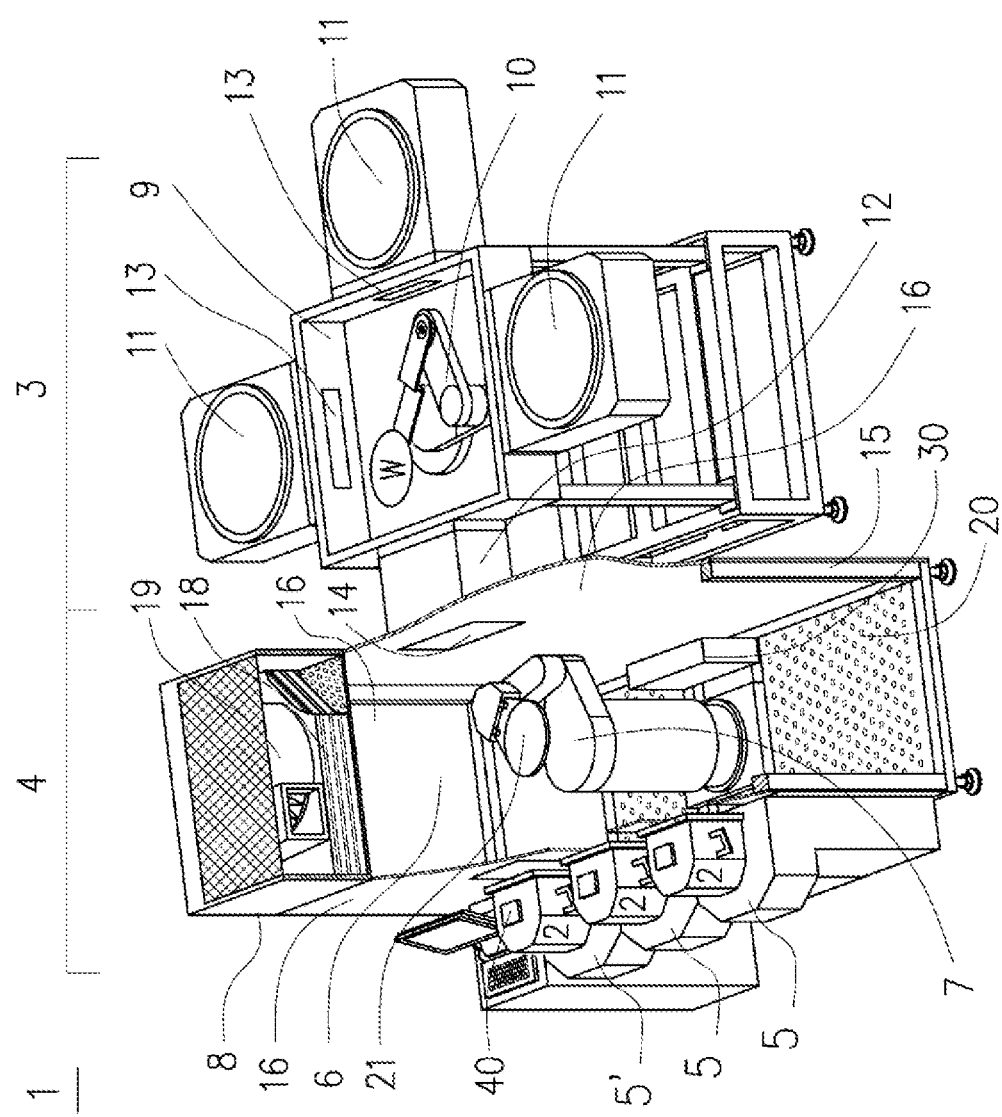
FIG. 4 is a perspective view showing the processing system.

Hereinafter, a processing system 1 of an embodiment of the present invention will be described in detail with reference to the drawings. FIG. 3 is a cross-sectional view showing the processing system 1 of the embodiment of the present invention, and FIG. 4 is a perspective view thereof. Although a processing target of the processing system 1 in the present embodiment is a semiconductor wafer W, the present invention is sufficiently applicable to processing systems of other thin plate-shaped substrates. The processing system 1 is installed in a factory called a clean room, which is controlled to a relatively clean atmosphere of about class 100 having a 0.5 micrometer dust and at a predetermined room temperature around 20° C. The processing system 1 of the present embodiment includes an EFEM 4 and a processing apparatus 3. Here, the EFEM 4 mounts an FOUP 2, which has been transported from the previous step, opens a door thereof, and exchanges the semiconductor wafer W stored in the FOUP 2 with the processing apparatus 3. Then, the processing apparatus 3 is to perform a predetermined processing on a surface to be processed (a surface) of the semiconductor wafer W. The EFEM 4 of the present embodiment includes a load port 5, a load port 5' with a replacement function, a mini environment space 6, a transport robot 7 for transporting the semiconductor wafer W in the mini environment space 6, and an FFU 8 for supplying a clean air downflow in the mini environment space 6. Further, the processing apparatus 3 of the present embodiment includes a transport chamber 9, a vacuum transport robot 10 which is disposed in the transport chamber 9 and transports the semiconductor wafer W in a vacuum atmosphere, a processing chamber 11 and a load lock chamber 12.

The processing apparatus 3 includes a processing chamber 11, a load lock chamber 12, a transport chamber 9, and a vacuum transport robot 10. The processing chamber 11 performs predetermined processing such as diffusion processing, etching processing, and heat processing on the surface of the semiconductor wafer W under a specified environment such as a vacuum atmosphere or an inert gas atmosphere. The load lock chamber 12 transfers semiconductor wafers W between the processing apparatus 3 and the mini environment space 6, and the transport chamber 9 is disposed adjacent to the processing chamber 11 and the load lock chamber 12. The vacuum transport robot 10 is disposed in the transport chamber 9 and transports the semiconductor wafer W between the load lock chamber 12 and the processing chamber 11 or between the processing chamber 11 and another processing chamber 11. In addition, the processing chamber 11 and the transport chamber 9, or the load lock chamber 12 and the transport chamber 9 are respectively configured so as to be airtightly closed by a partition member called a slit valve 13. Further, the load lock chamber 12 and the mini environment space 6 are configured so as to be airtightly closed by a partition member called a gate valve 14. In addition, a vacuum pump for drawing the internal atmosphere into a vacuum state and a pipe for introducing an inert gas from the outside are connected to the processing chamber 11, the transport chamber 9 and the load lock chamber 12. In addition, a pipe for supplying a reaction gas used to perform various surface processing is connected to the processing chamber 11.

The mini environment space 6 is a space maintained in a clean atmosphere to transport the semiconductor wafer W, and is formed by the transport space forming members between a frame 15 and a wall member 16 for separating from the external atmosphere. The FFU 8 is disposed on the ceiling of the mini environment space 6. The FFU 8 is provided with a fan 17 for supplying air downward for the mini environment space 6 and a high-performance filter 18 for removing contaminants such as minute dust and organic matter present in the supplied air. In addition, an opening for flowing out the clean air supplied from the FFU 8 outward the EFEM 4 is provided on the floor surface of the mini environment space 6. According to this configuration, the clean air supplied from the FFU 8 to the mini environment space 6 flows inside the mini environment space 6 in a downward laminar flow and flows out from the opening of the floor surface outward the apparatus. Further, in the EFEM 4 of the present embodiment, the air pressure inside the mini environment space 6 is maintained in the positive pressure of about 1.5 Pa more than the external atmosphere by adjusting a rotation speed of the fan 17 and an opening ratio of the opening due to the plate 20 disposed on the floor, thereby preventing contaminants and dust from entering from the outside. According to these configurations, dust generated from the driving mechanism such as the transport robot 7 or the like can flow out to the outside along the downward laminar flow, thereby also preventing the dust from entering from the outside. According to this, the mini environment space 6 is always maintained in a high clean atmosphere of class 1 or more with 0.5 micrometer dust.

Figure 5B:
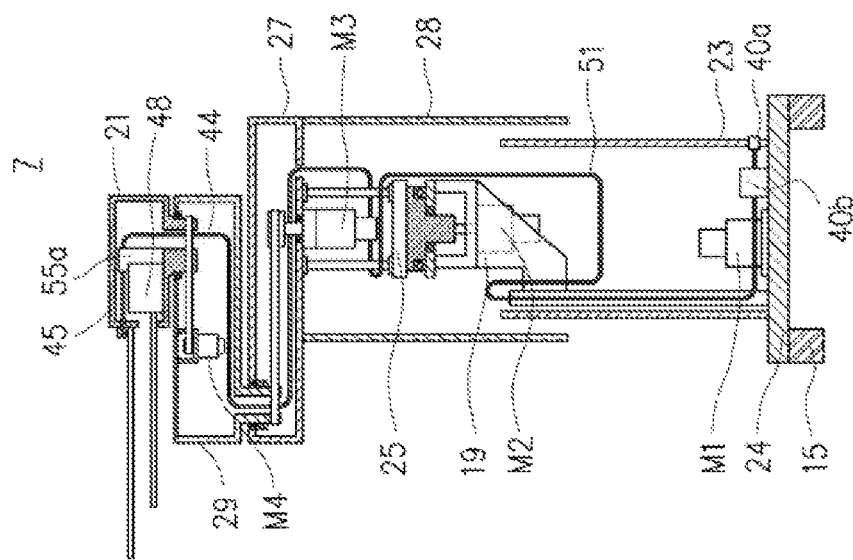
FIG. 5a and FIG. 5b are cross-sectional views showing a transport robot 7 of one embodiment of the present invention.
Figure 5A:
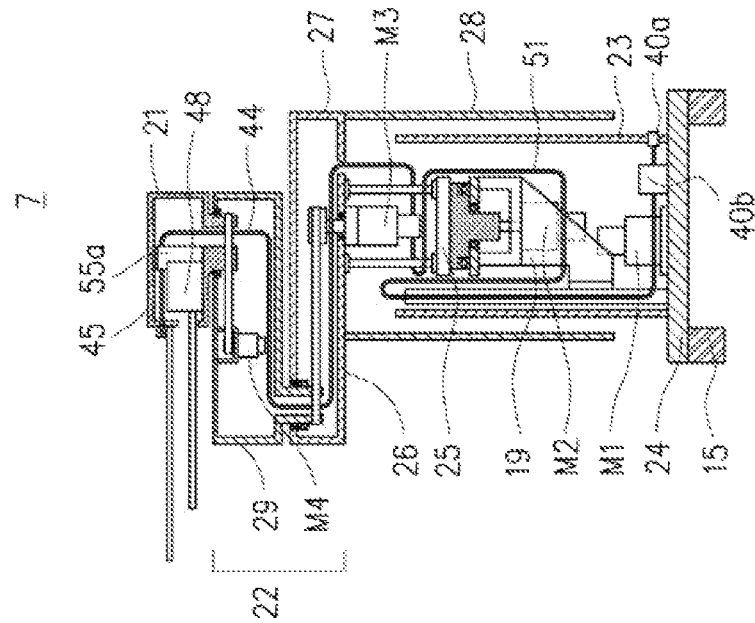

The transport robot 7 is disposed in the mini environment space 6 and transports the semiconductor wafer W between the FOUP 2 and the processing apparatus 3. FIG. 5a and FIG. 5b are cross-sectional views showing an outline of an atmosphere transport robot 7 of one embodiment of the present invention. The atmosphere transport robot 7 of the present embodiment is a scalar robot that is a clean robot capable of preventing the scattering of dust. The atmosphere transport robot 7 of the present embodiment includes a base 24 fixed to a frame 15 disposed on the bottom surface of the EFEM 4 and a body portion 25 capable of moving up and down and rotating with respect to the base 24. The base 24 is provided with a raising and lowering unit for moving the body portion 25 up and down, and the body portion 25 is supported through a bracket 19 by a moving element provided in the raising and lowering unit. The raising and lowering unit includes a guide member for guiding the body portion 25 in the vertical direction, a ball screw mechanism for moving the moving element fixed to the body portion 25 up and down by rotation of a screw shaft, and a motor M1 for driving the ball screw mechanism.

The body portion 25 includes a body frame 27 integrally formed at a proximal end of the first arm 26 and a body cover 28 fixed to the body frame 27. A second arm 29 is rotatably connected to the tip of the first arm 26 through a bearing, and an arm body 22 is composed of the first arm 26 and the second arm 29. The body frame 27 is rotatably mounted on the bracket 19 through a bearing, and is turned within the horizontal plane by a motor M2 provided on the bracket 19. Thus, the first arm 26 integrated with the body frame 27 is also turned within the horizontal plane together with the body frame 27.

The proximal end of the second arm 29 is rotatably supported through a bearing at the tip end of the first arm 26 (body frame 27). In addition, a wrist block 21 of the holding device 45 according to the embodiment of the present invention is rotatably connected to the tip of the second arm 29 through a bearing. The first arm 26 (body frame 27) is a housing in the form of a box having a hollow inside, and therein, a motor M3 for driving the second arm 29 and a transmission mechanism such as a pulley or a belt for transmitting the driving force from the motor M3 are located. According to this, the second arm 29 is turned within the horizontal plane by the operation of the motor M3. The second arm 29 is also a housing in the form of a box having a hollow inside, and therein, a motor M4 for driving the holding device 45 and a transmission mechanism such as a pulley or a belt for transmitting the driving force from the motor M4 are located. According to this, the holding device 45 is turned within the horizontal plane by the operation of the motor M4. Besides, a configuration including a motor M4 for driving the holding device 45 and a transmission mechanism such as a pulley or a belt for transmitting the driving force of the motor M4 is called a wrist drive mechanism herein.

According to the above configuration, the first arm 26 and the second arm 29 rotate in the opposite direction in conjunction with each other, whereby the arm 22 is bent and extended, and the holding device 45 disposed at the tip of the arm 22 is moved back and forth. The configuration including a motor M2 for driving the first arm 26, a motor M3 for driving the second arm 29, and a transmission mechanism such as a pulley or a belt for transmitting the driving force of each motor is called an arm body driving mechanism herein. In addition, the holding device 45 is turned in the direction opposite to the rotation direction of the second arm 29 by the operation of the motor M4, so that the holding device 45 can maintain posture to face in a constant direction. Besides, each opening portion of these housings in the form of a box is sealed by a lid, so that dust generated by the operation of the pulley or the belt does not scatter to the outside.

A base cover 23 for covering a drive unit and electronic components disposed on the base 24. is mounted inside the body cover 28 mounted on the side surface of the body 25 with a predetermined gap. The body cover 28 is formed such that the lower end is positioned below the upper end of the base cover 23 even when the body 25 moves up to the highest position, and prevents dust generated from the body 25 and the mechanism such as the motor M1 disposed on the base 24, the belt or the pulley from scattering outside the atmosphere transport robot 7. In addition, a joint 40a for connecting pipes laid from an inert gas supply source (not illustrated) and a piping member 44 for supplying an inert gas from the joint 40a to the holding device 45 are disposed to the transport robot 7 of the present embodiment. Further, a filter 40b for removing dust and impurities contained in the inert gas is provided in the middle of the piping member 44. Besides, in addition to the filter 40b, a temperature control device for adjusting the temperature of an inert gas and an ionizer for discharging an inert gas can be provided.

Further, the transport robot 7 according to the present embodiment is connected to a control unit 30 for controlling the operation of each drive unit in accordance with position data and speed data which are taught and stored in advance by transmitting and receiving signals to and from the host PC. See FIGS. 3 and 4. The control unit 30 controls, in addition to the operation control of the drive unit, so as to maintain the appropriate state by receiving the signals transmitted from the electric components provided to the transport robot 7, such as control of an electromagnetic valve 55a for switching the supply and shut-off of an inert gas and control of the temperature control device and the ionizer. Besides, the filter 40b provided in the transport robot 7 according to the present embodiment is made of polytetrafluoroethylene (PTFE), and can filter 99% or more of the 0.01 micrometer dust contained in the inert gas. Further, the filter 40b can be disposed not only in the main body of the transport robot 7 but also in a wrist block 21.

Figure 6A:
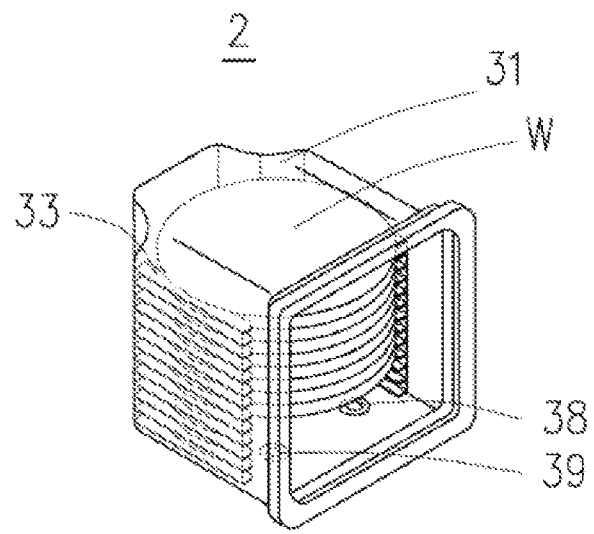
FIG. 6a is a perspective view showing overview of an FOUP 2.
Figure 6B:
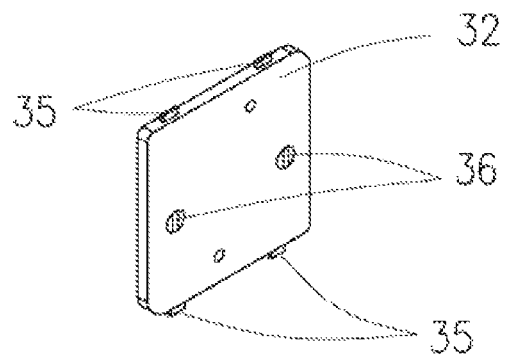
FIG. 6b is a perspective view of a lid of the FOUP 2 taken from a front vantage point.
Figure 6C:
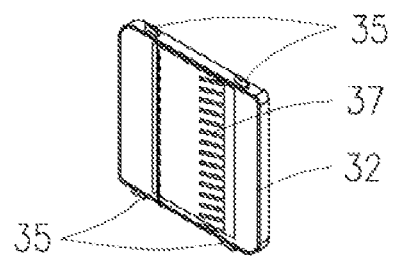
FIG. 6c is a perspective view of the lid taken from a rear vantage point.

Next, the FOUP 2 as one example of a sealable container will be described with reference to FIG. 6a, FIG. 6b and FIG. 6c. FIG. 6a is a perspective view showing the FOUP 2. The FOUP 2 is a sealable container for isolating the semiconductor wafer W to be stored from a low clean external atmosphere by maintaining the inside in a highly clean atmosphere, and for transferring the semiconductor wafer W among the processing systems 1 disposed in a clean room. The FOUP 2 includes a carrier 31 that is a box-like container for storing the semiconductor wafer W inside, and a lid 32 (as seen in FIGS. 6b and 6c) for airtightly closing an open face provided on the carrier 31. In addition, a plurality of shelf plates 33 on which the semiconductor wafer W is placed in a horizontal state are provided on the inner wall of the carrier 31 at predetermined intervals in the vertical direction. The semiconductor wafer W is placed on each shelf plate 33 with the surface to be processed facing upward. The lid 32 is provided with a lock mechanism, whereby an engagement or a release between the lid 32 and the carrier 31 can be achieved by retractingly moving a lock member 35 with respect to an engagement hole 34 formed around opening of the carrier 31. Besides, the lock mechanism is connected to a latch key 36 provided on the lid 32, and retractingly moves the lock member 35 by rotating the latch key 36 clockwise or counterclockwise. Thus, rotating the latch key 36 in a predetermined direction enables the carrier 31 and the lid 32 to be switched between the locked state and the unlocked state. The latch key 36 is rotated by hand or a lid opening/closing mechanism 43 of the load port 5 described below.

A member called a retainer 37 is provided on the surface facing the carrier 31 of the lid 32 to restrict the movement of the semiconductor wafer W during transfer of the FOUP 2 by horizontally pressing the edge of the semiconductor wafer W housed in the carrier 31. In addition, a suction port 38 for sucking the atmosphere into the FOUP 2 and a supply port 39 for supplying an inert gas into the FOUP 2 are provided on the bottom surface of the carrier 31. The suction port 38 and the supply port 39 are constructed so as to replace the atmosphere inside the FOUP 2 with the inert gas atmosphere by being respectively connected to a suction nozzle 38' and a supply nozzle 39' provided on the load port 5. Besides, a vertical pitch of the shelf plates 33 formed on the carrier 31 of the FOUP 2 is defined by SEMI (Semiconductor Equipment and Materials International) standard, which is an international standard in the field of semiconductor manufacturing equipment and materials. In the case of the FOUP 2 that accommodates the semiconductor wafer W having a diameter of 300 mm, the pitch of the shelf plates 33 is defined as 10 mm. When subtracting 1 mm of the thickness of the shelf plate 33 and about 0.8 mm of the thickness of the semiconductor wafer W similarly defined by SEMI, the vertical dimension accessible by the purge plate 46 and the holding member of the holding device of the present invention is assumed about 8 mm.

Figure 7:
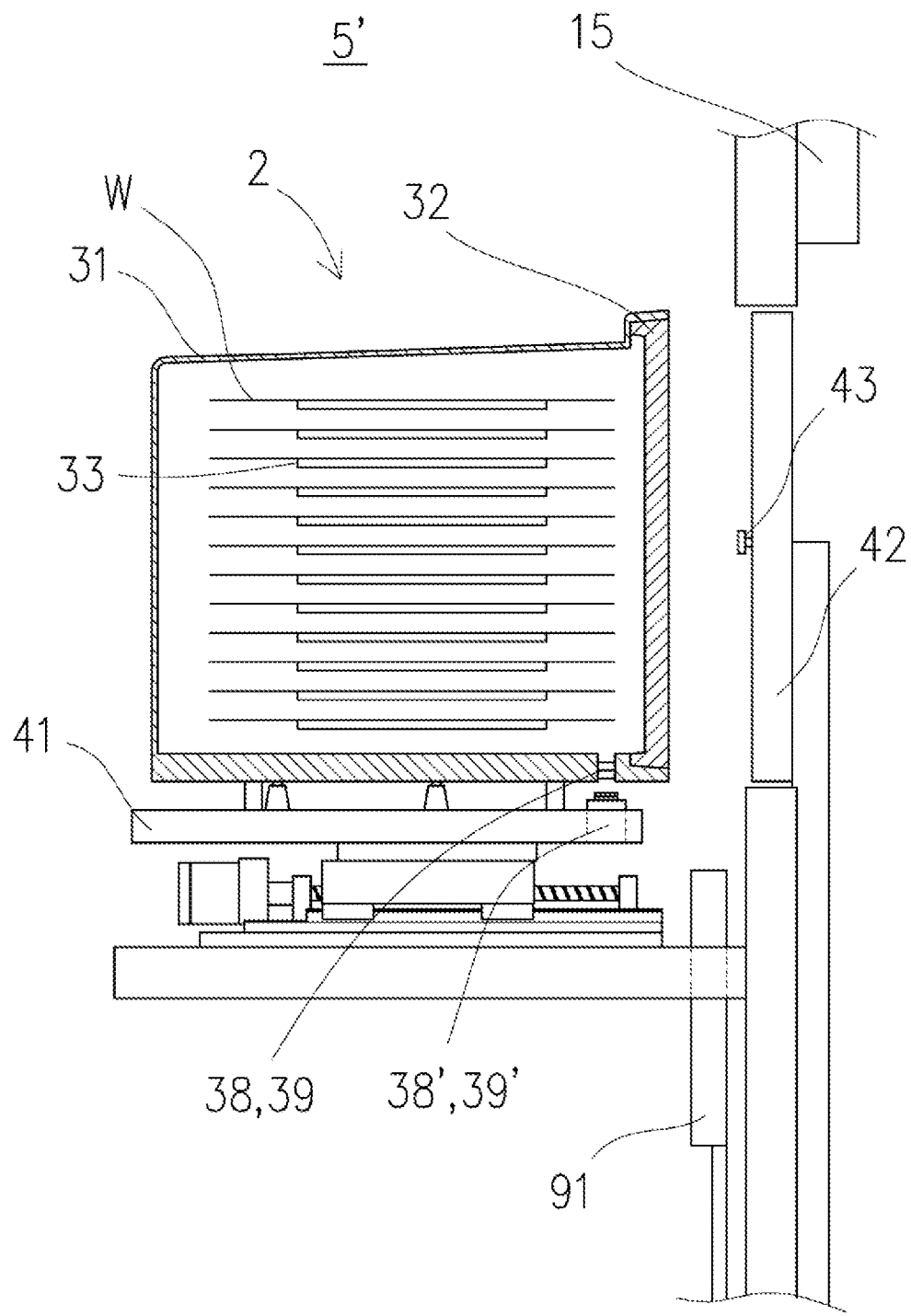
FIG. 7 is a cross-sectional view of overview of a load port 5 with a replacement function.

Next, a known load port 5 and a load port 5' having a replacement function included in the EFEM 4 of the present embodiment will be described. FIG. 7 is a cross-sectional view showing one example of the load port 5' with replacement function. The load port 5 is fixed on the frame 15 forming the mini environment space 6, and is a device to mount the FOUP 2 carried from the previous step and to separate the lid 32 for closing the inside of the FOUP 2 from the carrier 31. The load port 5 is provided with a stage 41 for mounting the FOUP 2 at a predetermined position by the positioning mechanism, an FIMS door 42 integrated with the lid 32 of the FOUP 2, and a lid opening/closing mechanism 43 for rotating the latch key 36 provided on the lid 32. Here, the lid opening/closing mechanism 43 is provided on the FIMS door 42. Further, driving mechanisms (not illustrated) are provided to the stage 41 and the FIMS door 42 to move them in a predetermined direction, respectively.

When the FOUP 2 is carried on the stage 41, the load port 5 advances the stage 41 toward the FIMS door 42 to bring the lid 32 into contact with the FIMS door 42. Next, the load port 5 operates the lid opening/closing mechanism 43 to rotate the latch key 36 provided on the lid 32 until the lock member 35 is unlocked, and then moves the stage 41 or the FIMS door 42 to separate the lid 32 and the carrier 31. Thereafter, the load port 5 lowers the FIMS door 42 integrated with the lid 32 to a position that does not interfere with the wafer access operation of the transport robot 7, and forwardly moves the stage 41 with the carrier 31 to a position that the transport robot 7 can access to the semiconductor wafer W. Besides, when the transportation of the processed semiconductor wafer W to the carrier 31 is completed, the load port 5 operates the stage 41 and the FIMS door 42 to airtightly close the opening of the carrier 31 with the lid 32.

Next, the load port 5' having a function for replacing the inside of the FOUP 2 with an inert gas atmosphere by supplying an inert gas into the FOUP 2 in addition to the function of the general load port 5 as described above will be described. The EFEM 4 of the present embodiment includes at least one load port 5' with replacement function. The load port 5' with replacement function provided in the present embodiment includes a suction nozzle 38' and a supply nozzle 39' in addition to the configuration of the general load port 5. The suction nozzle 38' is connected to a suction pump (not illustrated), and fills the internal atmosphere of the FOUP 2 with an inert gas through the suction port 38 of the FOUP 2. Further, the supply nozzle 39' is connected to an inert gas source (not illustrated), and fills the inside of the FOUP 2 with an inert gas through the supply port 39 of the FOUP 2. In addition, a raising and lowering means for moving the suction nozzle 38' and the supply nozzle 39' up and down, respectively, is provided in the stage 41, and moves upward the suction nozzle 38 'and the supply nozzle 39' to connect to the ports 38, 39, respectively when the atmosphere replacement is required, and moves downward the suction nozzle 38' and the supply nozzle 39' when the atmosphere replacement is unnecessary.

In addition, some load ports are provided with a purge nozzle 91 that moves upward to a position facing the open face of the carrier 31 after door-opening of the FOUP 2 and fills the inside of the carrier 31 with an inert gas, in addition to the suction nozzle 38' and the supply nozzle 39'. The purge nozzle 91 is a box-like member having discharging ports at the position facing the open face of the carrier, and is connected to the inert gas supply source (not illustrated). Further, the purge plate is supported by a raising and lowering means (not illustrated), and is constructed so as to supply an inert gas into the carrier 31 by moving upward when the transport robot 7 does not access inside the carrier 31. In addition, the purge plate is constructed so as to move downward to a position that does not interfere the movement of the transport robot 7 by stopping supplying an inert gas when the transport robot 7 accesses inside the carrier 31. Setting an internal atmosphere of the FOUP 2 containing the processed semiconductor wafer W to an inert gas atmosphere by the load port 5' with replacement function can prevent natural oxidation of the surface to be processed of the semiconductor wafer W. Besides, as another embodiment of the load port 5' with replacement function, for example, there is one that locates a nozzle for injecting an inert gas near the opening of the carrier 31. However, the load port 5' with replacement function mounted on the EFEM 4 in the present invention is not limited to the above-described embodiment, and may be in any form as long as the atmosphere inside the FOUP 2 can be replaced with an inert gas atmosphere.

Figure 8A:
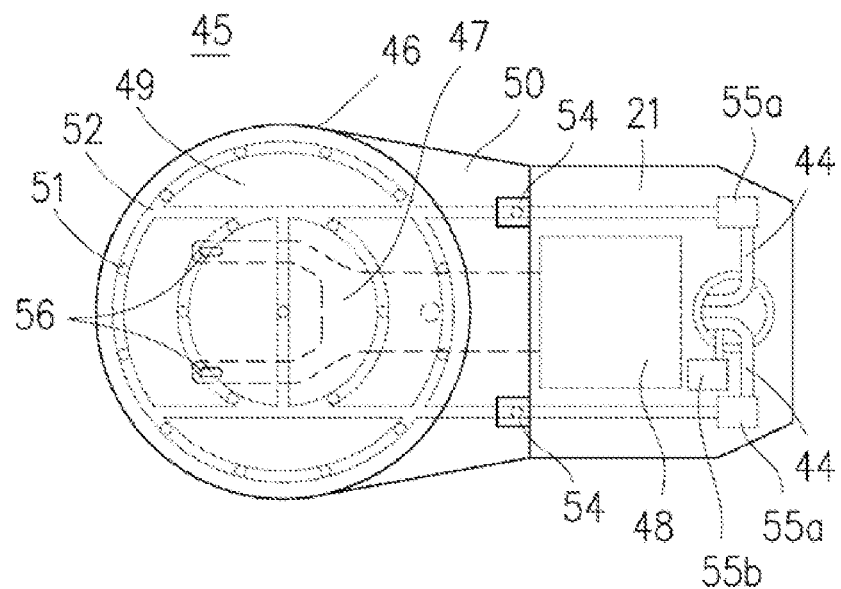
FIG. 8a is a top or plan view showing a holding device 45 of one embodiment of the present invention.
Figure 8B:
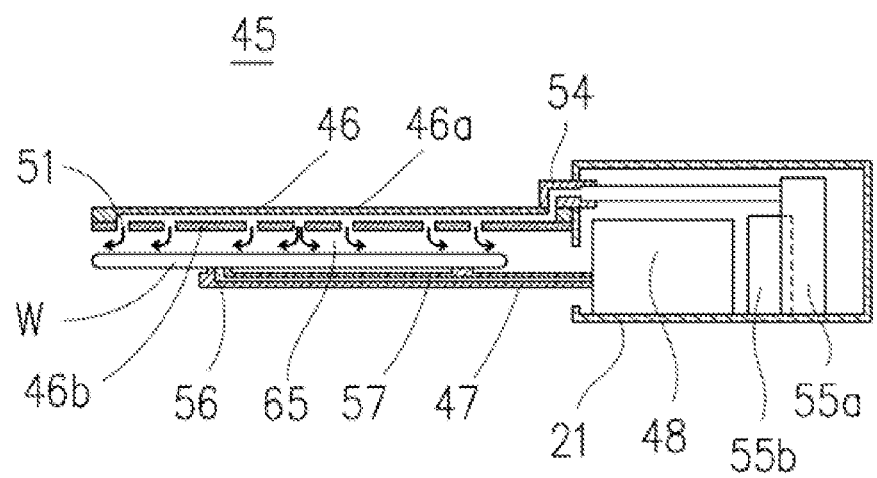
FIG. 8b is a cross-sectional device of the holding device 45 and FIG. 8c is a cross-sectional view showing inclined discharge ports.
Figure 8C:
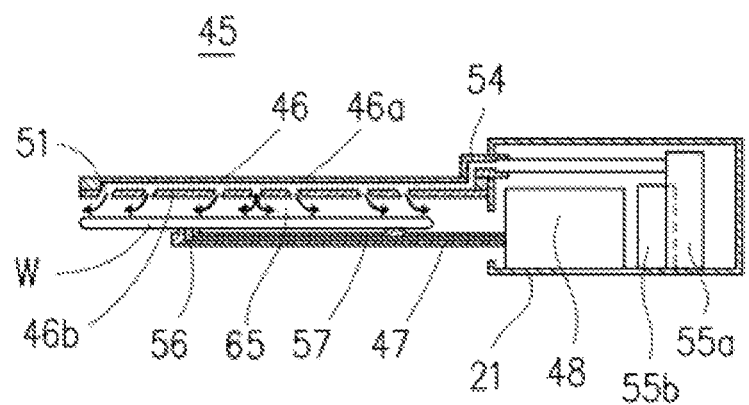
Figure 13C:
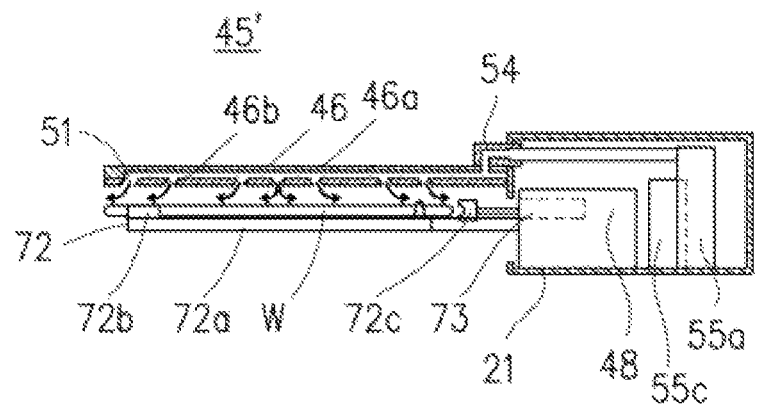
FIG. 13b is a cross-sectional view of the holding device 45' and FIG. 13c is a cross-sectional view showing inclined discharge ports.

Next, a holding device 45 with purge function which is one embodiment of the present invention will be described. FIG. 8a and FIG. 8b are views-showing the holding device 45. FIG. 8a is a view of the holding device 45 as viewed from above, and FIG. 8b is a cross-sectional view as viewed from the side. The holding device 45 of the present embodiment includes a wrist block 21 that is rotatably fixed to the tip of the second arm 29, a purge plate 46 that discharges an inert gas toward the surface to be processed of the semiconductor wafer W, a holding member 47 that holds the semiconductor wafer W, and a raising and lowering mechanism 48 for moving the holding member 47 up and down. The purge plate 46 of this embodiment includes a disk-shaped purge part 49 having a diameter substantially the same as the diameter of the semiconductor wafer W to be held, and a base 50 that is connected to the purge part 49 and fixed to the wrist block 21. The purge part 49 is provided with a plurality of discharging ports 51 for spraying an inert gas onto the surface to be processed of the held semiconductor wafer W at predetermined positions. The purge part 49 supplies an inert gas to the entire surface to be processed of the semiconductor wafer W while blocking the downflow of the clean air supplied from the FFU 8, and has a diameter substantially the same as the diameter of the semiconductor wafer W in order to avoid colliding with a wall surface of the storage container such as the FOUP 2 when being inserted into the FOUP 2.

The purge plate 46 of this embodiment includes two members of an upper member 46a in which an inert gas flow path 52 is formed and a lower member 46b in which a plurality of through holes (discharging ports) 51 for discharging an inert gas are formed. The through holes (discharging ports) 51 provided in the lower member 46b are disposed at positions communicating with the flow path 52 when the upper member 46a and the lower member 46b are bonded together, and the inert gas supplied into the flow path 52 is supplied from the through holes 51 toward the surface to be processed of the semiconductor wafer W. In addition, a joint member 54 is attached to the upper member 46a at a position communicating with the flow path 52, and a piping member 44 through which an inert gas flows is connected to the joint member 54 through an electromagnetic valve 55a. The proximal end portion of the piping member 44 is connected to an inert gas supply source (not shown) through a joint 40a. The electromagnetic valve 55a is configured to open and close the valve by a control signal transmitted from the control unit 30, wherein supply and stop of the inert gas supplied from the purge plate 46 is controlled by signal from the control unit 30. Besides, anodized aluminum is used as the material of the purge plate 46 of the present embodiment, but the present invention is not limited to this, and materials such as ceramic, carbon, and engineering plastic can be also used enough.

The purge plate 46 of the present invention is not limited to the above-mentioned shape, and can be formed smaller than the diameter of the substrate to be held or can be formed larger than the diameter of the substrate to be held so that it does not collide with walls of the wafer storage container or the wafer mounting device. In addition, the purge plate 46 can be made in a shape such as a square, a rectangle, or a hexagon not limited to a disc shape.

The holding member 47 provided in the holding device 45 of the present embodiment has a substantially Y-shape with a tip portion divided into two branches, and each tip portion divided into the two branches has an adsorption hole 56 for vacuum-sucking the semiconductor wafer W. The adsorption hole 56 communicates with a vacuum pump through a vacuum flow path 57 formed inside the holding member 47 and a vacuum pipe provided in the transport robot 7. In addition, the vacuum pipe is provided with an electromagnetic valve (not shown), and the electromagnetic valve is opened or closed by a control signal transmitted from the control unit 30.

Figure 9A:
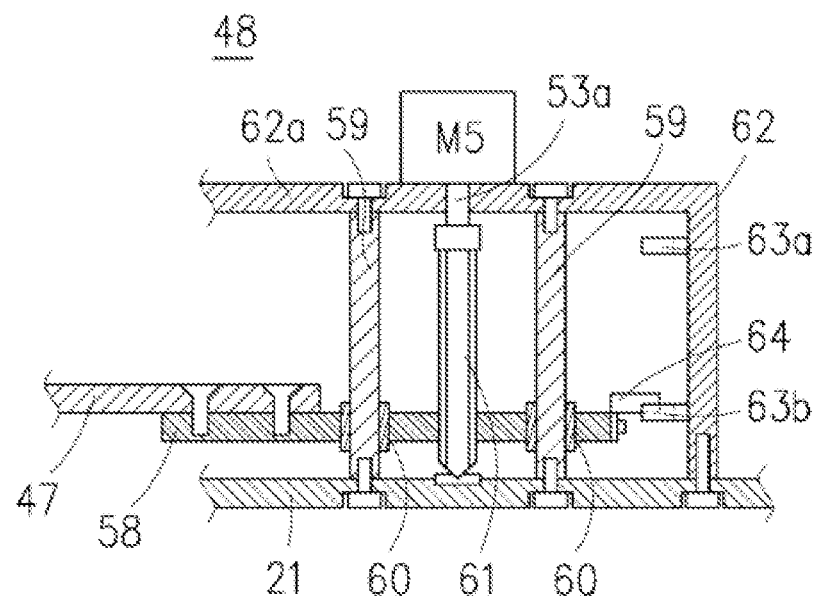
FIG. 9a and FIG. 9b are cross-sectional views showing a raising and lowering mechanism 48 provided in the present invention.
Figure 9B:
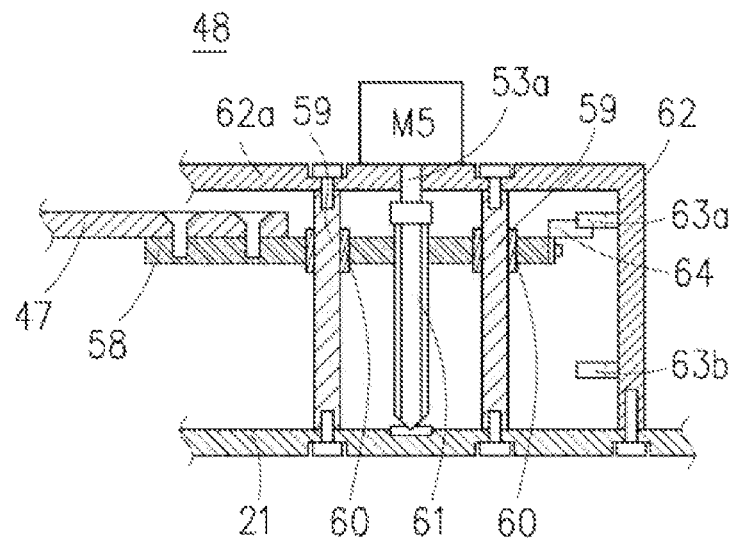

The proximal end portion of the holding member 47 of the present embodiment is fixed on the raising and lowering member 58 of the rising and lowering mechanism 48 for moving the holding member 47 up and down. FIG. 9a and FIG. 9b are cross-sectional views showing the raising and lowering mechanism 48 of the present embodiment. The raising and lowering mechanism 48 of the present embodiment includes two linear shafts 59 erected so as to be parallel to each other on the bottom plate of the wrist block 21, the raising and lowering member 58 attached movably inside the surface guided by the linear shafts 59 through a linear motion bearing 60, a feed screw 61 arranged parallel to the linear shafts 59 and screwed to the raising and lowering member 58, and a motor M5 for moving the raising and lowering member 58 up and down by rotating the feed screw 61 by rotating a driving shaft 53a that is connected to the proximal end portion of the feed screw 61. Further, a substantially L-shaped support member 62 is fixed to the wrist block 21. The upper ends of the two linear shafts 59 and the motor M5 main body are fixed to the surface disposed in parallel to the wrist block 21 of the support member 62. Limit sensors 63a, 63b for detecting an ascending position and a descending position of the raising and lowering member 58 are attached to the surface disposed perpendicular to the wrist block 21 of the support member 62. The limit sensors 63a and 63b are transmitted light sensors that react by receiving an optical axis projected from a light projecting unit with a light receiving unit, and detect that the raising and lowering member 58 has reached the limit position because a sensor dog 64 mounted on the raising and lowering member 58 interrupts the optical axis due to upward and downward movement of the raising and lowering member 58.

The motor M5 and the limit sensors 63a, 63b are electrically connected to the control unit 30 through cables. The control unit 30 moves the raising and lowering member 58 up and down by transmitting a predetermined operation signal to the motor M5. Then, it is detected that the raising and lowering member 58 has reached the limit position by detecting that the sensor dog 64 of the raising and lowering member 58 blocks the optical axes of the limit sensors 63a, 63b, and the operation of the motor M5 is stopped. The motor M5 provided in the raising and lowering mechanism 48 of the present embodiment is a stepping motor capable of controlling the rotation angle of the drive shaft 53a, and the control unit 30 is so configured that the raising and lowering member 58 is moved to a predetermined position with high accuracy. With the above configuration, the control unit 30 can move the raising and lowering member 58 and the holding member 47 fixed to the raising and lowering member 58 to a predetermined height position.

Figure 10A:
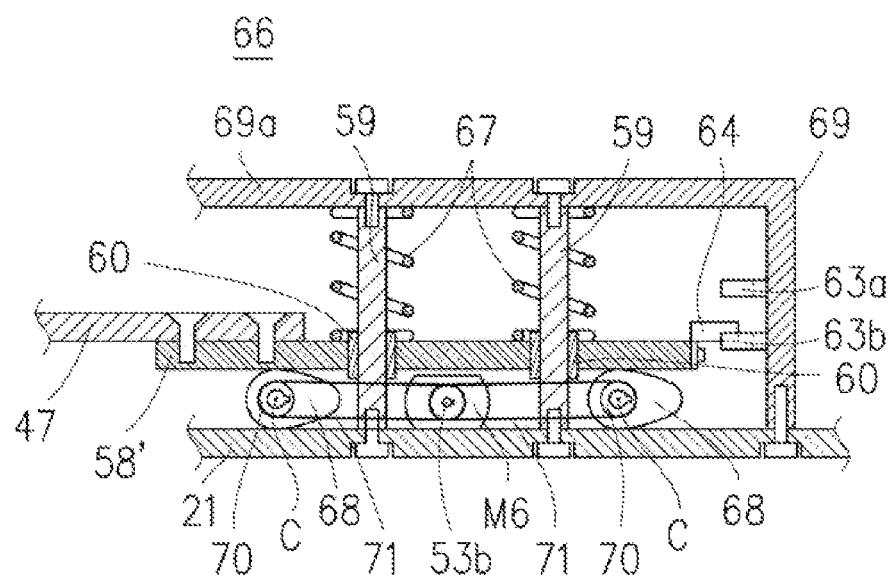
FIG. 10a and FIG. 10b are cross-sectional views showing a raising and lowering mechanism 66 provided in the present invention.
Figure 10B:
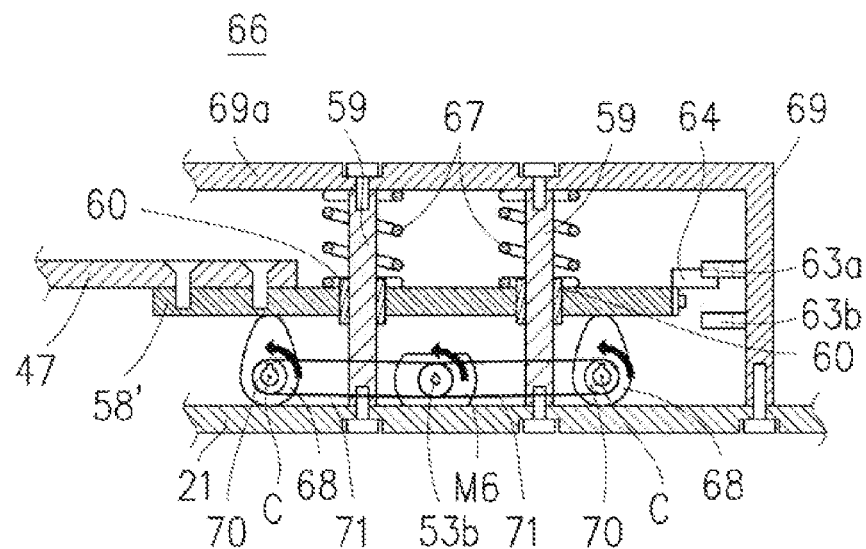

In the raising and lowering mechanism 48 of the present embodiment, the linear shaft 59 is rotated by operating the motor M5, and the holding member 47 is moved up and down by moving the raising and lowering member 58 screwed with the linear shaft 59 up and down. The mechanism for moving the holding member 47 up and down can also take other forms. FIG. 10a and FIG. 10b are views showing a raising and lowering mechanism 66 for moving the holding member 47 up and down. The raising and lowering mechanism 66 of the present embodiment includes two linear shafts 59 erected so as to be parallel to each other on the bottom plate of the wrist block 21, a raising and lowering member 58' movably attached through a linear bearing 60 within a surface that the linear shaft 59 guides with a base end portion of the holding member 47 being fixed, an urging member 67 for urging the raising and lowering member 58' downward as viewed in the drawing, a cam member 68 for displacing the vertical position of the raising and lowering member 58' by rotating, and a motor M6 for rotating the cam member 68. Further, a substantially L-shaped support member 69 is fixed to the wrist block 21, and top ends of two linear shafts 59 are fixed on a surface 69a of the support member 69 disposed in parallel to the bottom plate of the wrist block 21. Similarly to the raising and lowering mechanism 48, limit sensors 63a, 63b for detecting the ascending position and the descending position of the raising and lowering member 58 are attached on the surface of the support member 69 disposed perpendicular to the bottom surface of the wrist block 21. The limit sensors 63a, 63b are transmitted light sensors that react by receiving the optical axis projected from the light projecting unit at the light receiving unit, and detect that the raising and lowering member 58 reaches the limit position since the sensor dog 64 attached to the raising and lowering member 58' interrupts the optical axis according to upward and downward movement of the raising and lowering member 58.

The cam members 68 included in the raising and lowering mechanism 66 of the present embodiment are parallel to the bottom plate of the wrist block 21 and all cam members 68 are fixed on both ends of the two cam shafts 70 which are disposed so as to be parallel to each other so as to be at the same rotational position. The cam shafts 70 are rotatably supported by the bottom plate of the wrist block 21 through a bearing (not shown). In addition, pulleys having the same diameter are fixed coaxially to each one end of the two cam shafts 70. Further, a timing belt 71 is stretched between these pulleys and pulleys fixed to the drive shaft 53b of the motor M6, respectively. With this configuration, when the drive shaft 53b of the motor M6 rotates, the two cam shafts 70 rotate in the same direction as the rotation direction of the motor M6. All the cam members 68 fixed to the two cam shafts 70 also rotate in the same direction as the rotation direction of the motor M6. The four cam members 68 provided in the raising and lowering mechanism 66 of the present embodiment are substantially egg-shaped plate cams, and the raising and lowering member 58', which is a follower, performs a raising and lowering motion by rotating. Further, the raising and lowering member 58' is urged downward by the urging member 67, so that the raising and lowering member 58' can accurately follow a change in the lift amount due to the rotation of the cam member 68.

FIG. 10a is a view showing the position of the raising and lowering member 58 when the cam member 68 is in the first rotational position. The first rotational position is a state in which the raising and lowering member 58 is supported on the peripheral edge portion closest to the rotational center axis C of the cam member 68, and at this time, the raising and lowering member 58 is at a position where it is most lowered with respect to the wrist block 21. At this time, the sensor dog 64 fixed to the raising and lowering member 58' is at a position to block the optical axis of the limit sensor 63b, and the control unit 30 can recognize that the raising and lowering member 58' and the holding member 47 fixed to the raising and lowering member 58' are at the lowest position. FIG. 10b is a view showing a state in which the motor M6 is operated and the drive shaft 53b is rotated 90 degrees counterclockwise from the state of FIG. 10a. The rotational position of the cam member 68 at this time is the second rotational position, wherein the raising and lowering member 58 is supported on the peripheral edge portion farthest from the rotational center axis C of the cam member 68. At this time, the raising and lowering member 58 is located at the most raised position with respect to the wrist block 21. At this time, the sensor dog 64 is located in a position to shield the optical axis of the limit sensor 63a, and the control unit 30 can recognize that the raising and lowering member 58 and the holding member 47 fixed to the raising and lowering member 58 are in the most raised position.

The motor M6 provided in the raising and lowering mechanism 66 of this embodiment is a stepping motor that can easily control the angle, and the control unit 30 can move the raising and lowering member 58' and the holding member 47 fixed to the raising and lowering member 58 to a desired raised position and a desired lowered position within the range of the lift amount of the cam member 68. Besides, the holding device of the present invention can sufficiently include a raising and lowering mechanism using a known mechanism such as an air cylinder or an electromagnetic actuator in addition to the raising and lowering mechanism using the above-mentioned feed screw 61 or cam member 68.

Next, the wrist block 21 of the present embodiment will be described. The wrist block 21 is a member for supporting the purge plate 46 and the raising and lowering mechanism 48, and the purge plate 46 and the raising and lowering mechanism 48 of the present embodiment is fixed to the wrist block 21 by screws. The wrist block 21 of the present embodiment is a box-shaped member made of aluminum, and the base end portion thereof is connected to the tip of the arm body 22 of the transport robot 7. An electromagnetic valve 55a, which controls supplying and closing of an inert gas to the purge plate 46, and an electromagnetic valve 55b, which performs opening and closing a vacuum line to the holding member 47, are provided in the wrist block 21. The electromagnetic valves 55a, 55b of the present embodiment are known electromagnetic valves, respectively, and block or open the flow paths formed inside the electromagnetic valves 55a, 55b in accordance with the electric signals transmitted from the control unit 30 provided in the transport robot 7. Besides, although the transport robot 7 of the present embodiment is provided with the electromagnetic valves 55a, 55b in the wrist block 21, the present invention is not limited to this, the electromagnetic valves 55a, 55b may be provided in the main body of the transport robot 7 or in the arm body 22.

The holding device 45 of the present embodiment can hold the back surface of the semiconductor wafer W by sucking it with the holding member 47, and discharge an inert gas from the purge plate 46 disposed above the holding member 47 toward the surface to be processed. Here, the surface to be processed is the surface of the semiconductor wafer W. The inert gas discharged from the purge plate 46 toward the semiconductor wafer W fills the space 65 formed by the purge plate 46 and the semiconductor wafer W, and flows out of the space 65 together with the air remaining in the space 65. Then, the air remaining in the space 65 and the reactive gas components remaining on the circuit pattern of the semiconductor wafer W are discharged outsides the space 65 together with the inert gas by continuously supplying an inert gas, and therefore, the space 65 is replaced with an inert gas atmosphere. Further, since the inert gas supplied into the space 65 sequentially flows out of the space from the gap between the holding device 45 and the thin-shaped plate substrate W, the flow of the inert gas flowing out of the space 65 serves as a shield, and prevents the air from entering the surface to be processed which is the upper surface of the thin-shaped plate substrate W. According to this, since the space 65 is always maintained in an inert gas atmosphere, it is possible to prevent a natural oxide film from being formed on the surface to be processed of the thin-shaped plate substrate W. See FIG. 8b.

Next, regarding the operation in which the holding device 45 of the present embodiment holds the semiconductor wafer W and discharges an inert gas toward the surface to be processed of the semiconductor wafer W, it will be explained that the semiconductor wafer W' stored in the carrier 31 of the FOUP 2 is carried out, as an example. Besides, the operating positions of the transport robot 7 and the holding device 45 are taught in advance to appropriate positions by the operator. The semiconductor wafer W' that has been processed in the previous process is accommodated in the FOUP 2 and transported to the load port 5'. When the FOUP 2 is conveyed, the load port 5' fills the inside of the FOUP 2 with an inert gas. When the transport command of the semiconductor wafer W' stored in the FOUP 2 is received by the host computer, the load port 5 separates the cover 32 of the FOUP 2 from the carrier 31, moves the cover 32 downward, and moves the carrier 31 to a position where the transport robot 7 can be accessed. Next, the control unit 30 operates each drive mechanism of the transport robot 7 to move the holding device 45 to a predetermined position, and then forwardly moves the holding device 45 to a position capable of holding the semiconductor wafer W' inside the carrier 31 by operating the arm body 22.

Figure 11A:
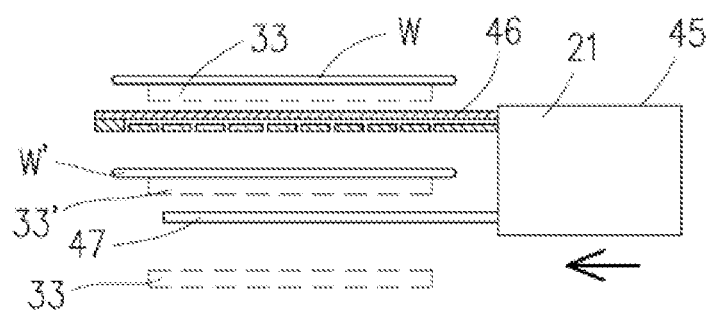
FIG. 11a, FIG. 11b and FIG. 11c are views showing a motion of the holding device 45 of one embodiment of the present invention.
Figure 11B:
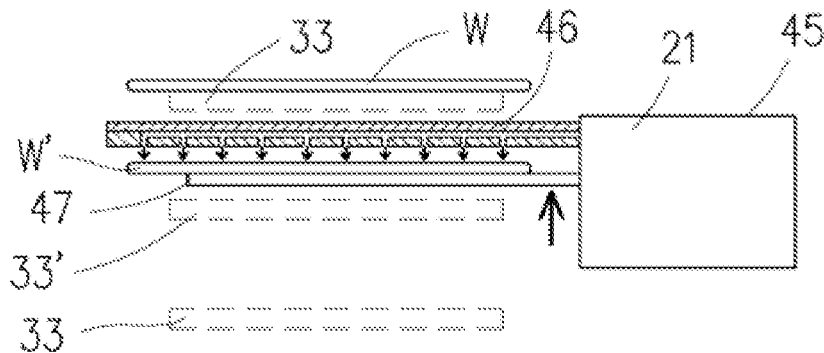

FIG. 11a is a cross-sectional view showing a state in which the holding device 45 has advanced to the inside of the carrier 31 for holding the semiconductor wafer W'. The semiconductor wafer W' to be held is placed in a horizontal state on a shelf plate 33' formed inside the carrier 31. When the holding device 45 advances to the inside of the carrier 31, the purge plate 46 is preliminarily taught so that the purge plate 46 is positioned above the target semiconductor wafer W' at a predetermined interval and the holding member 47 is positioned below the target semiconductor wafer W' at a predetermined interval. At this time, the holding member 47 capable of raising and lowering remains at a first position relatively lower within the movable range. When the holding device 45 moves to a predetermined position on semiconductor wafer W', the control unit 30 then activates the motor M5 to raise the holding member 47 to a predetermined second position, and further operates the electromagnetic valve 55a to start the supply of the inert gas toward the surface to be processed of the semiconductor wafer W'. See FIG. 11b. The rising position of the holding member 47 is a position where the holding member 47 supports the semiconductor wafer W' supported on the shelf plate 33' instead of the shelf plate 33' and where the semiconductor wafer W' does not come into contact with the shelf plate 33' when the holding device 47 moves back. Further, the upper surface of the semiconductor wafer W' is not brought into contact with the purge plate 46, and the purge plate 46 is positioned at a predetermined distance from the purge plate 46 at a position supported by the holding member 47.

Figure 11C:
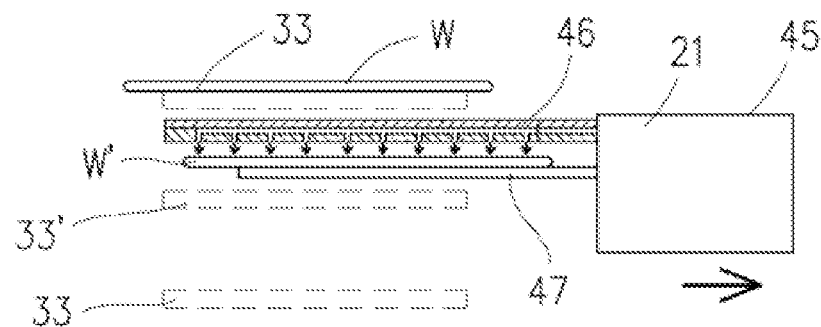

When the upward movement of the holding member 47 is completed, the control unit 30 activates the electromagnetic valve 55b to attract and hold the semiconductor wafer W' on the holding member 47. At this time, the control unit 30 determines whether or not the semiconductor wafer W' is normally held from the value of a pressure sensor (not shown) provided in the vacuum line. When it is determined that the holding of the semiconductor wafer W is normally performed, the control unit 30 moves the holding member 47 back from the carrier 31 by operating the arm body, and moves the semiconductor wafer W' to a target position by operating each drive mechanism of the transfer robot 7. See FIG. 11c. When the retreating movement of the holding device 45 from the carrier 31 is completed, the load port 5' is closed with the lid 32 of the FOUP 2 to restart the supply of the inert gas. When the inert gas continues to be supplied from the purge plate 46 during the transport of the semiconductor wafer W', the atmosphere inside the EFEM 4 is prevented from reaching the surface to be processed of the semiconductor wafer W', and the formation of a natural oxide film on the surface to be processed of the semiconductor wafer W' is prevented.

Further, when the holding member 47 is moved upward, the raising and lowering mechanism of the transport robot 7 does not perform the raising operation while the raising and lowering mechanism of the transport robot 7 is stopped. The holding device 45 attached to the arm body 22 and the purge plate 46 fixed to the holding device 45 do not move upward, and maintain the position when entering the inside of the carrier 31. Thereby, even if the purge plate 46 has the same diameter as the diameter of the semiconductor wafer W, the purge plate 46 does not collide with the shelf plate 33 formed in the inside of the carrier 31. Further, since there is no need to take into consideration the clearance for moving up and down, the thickness dimension of the purge plate 46 can be increased to such a degree that the thickness dimension of the purge plate 46 does not come into contact with the interval of each shelf plate 33, and thereby, the strength of the purge plate 46 can be increased. Further, since the flow path 52 of the inert gas can be increased, a large amount of inert gas can be supplied to the surface to be processed of the semiconductor wafer W.

Besides, the timing of starting the discharge of the inert gas may be started before the holding member 47 lifts the semiconductor wafer W', that is, when the holding device 45 enters the inside of the FOUP 2. In addition, the distance between the semiconductor wafer W and the purge plate 46 at the time of holding the semiconductor wafer W' by the holding member 47 is preferably set at an interval in which the semiconductor wafer W' does not come into contact with the purge plate 46 even if the semiconductor wafer W' vibrates in the vertical direction due to the influence of vibration caused by the operation of each drive unit of the transport robot 7.

Figure 12A:
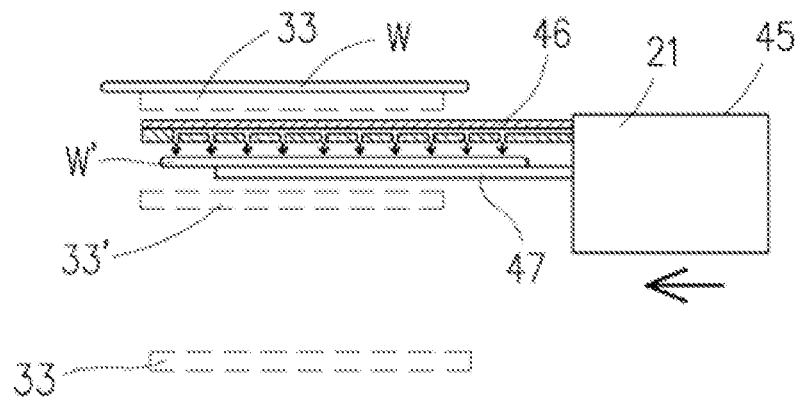
FIG. 12a, FIG. 12b and FIG. 12c are views showing a motion of the holding device 45 of one embodiment of the present invention.

Next, the operation when the holding member 47 of the present embodiment places the held semiconductor wafer W' on the shelf plate 33' of the carrier 31 will be described. The operation of placing the semiconductor wafer W' held by the holding member 47 on the carrier 31 is performed in a procedure roughly opposite to the operation of carrying out the semiconductor wafer W'. Besides, when the holding device 45 places the semiconductor wafer W on the shelf plate 33' of the carrier 31, the holding member 47 is moved to the second position described above. First, the control unit 30 operates each drive mechanism of the transport robot 7 to move the purge plate 46 and the holding member 47 to a predetermined position in advance inside the carrier 31. See FIG. 12a. Besides, the predetermined position means that the purge plate 46 and the holding member 47 are located above the shelf plate 33' on which the semiconductor wafer W' is placed at a predetermined interval and below the shelf plate 33 positioned right above the shelf plate 33' at a predetermined interval. Further, an inert gas is supplied from the purge plate 46 toward the surface to be processed of the semiconductor wafer W.

Figure 12B:
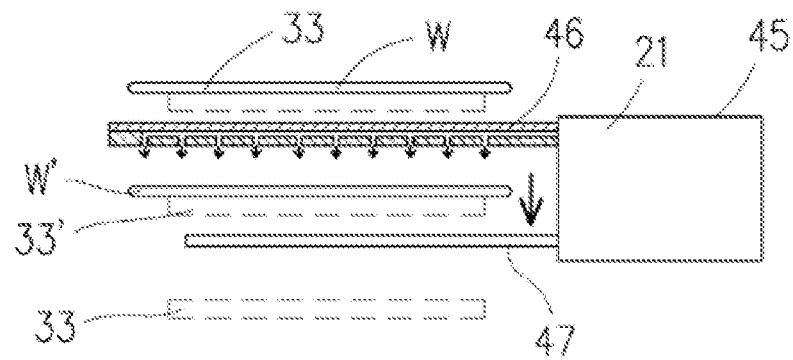
Figure 12C:
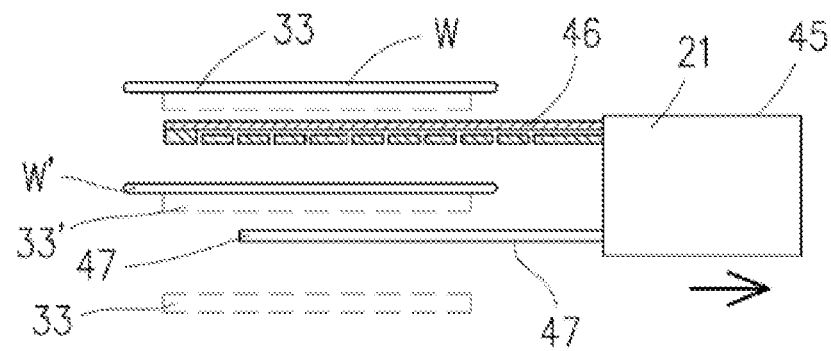

Next, the control unit 30 operates the electromagnetic valve 55b to release the adsorption of the semiconductor wafer W' by the vacuum pressure. Thereafter, the control unit 30 causes the motor M5 to operate and lowers the holding member 47 to a predetermined first position. See FIG. 12b. According to the lowering operation of the holding member 47, the semiconductor wafer W' supported by the holding member 47 is transferred from the holding member 47 to the shelf plate 33'. Besides, during this operation, since the raising and lowering mechanism of the transport robot 7 remains stopped, so that the purge plate 46 remains at a position between the shelf plate 33' and the shelf plate 33 just above the shelf plate 33'. When the downward movement of the holding member 47 is completed, the control unit 30 moves the holding member 47 backward from the carrier 31 by operating the arm body, and operates the electromagnetic valve 55a to stop the supply of the inert gas. Next, the control unit 30 operates each drive mechanism of the transport robot 7 to move the semiconductor wafer W' to a predetermined standby position. See FIG. 12c.

Figure 13A:
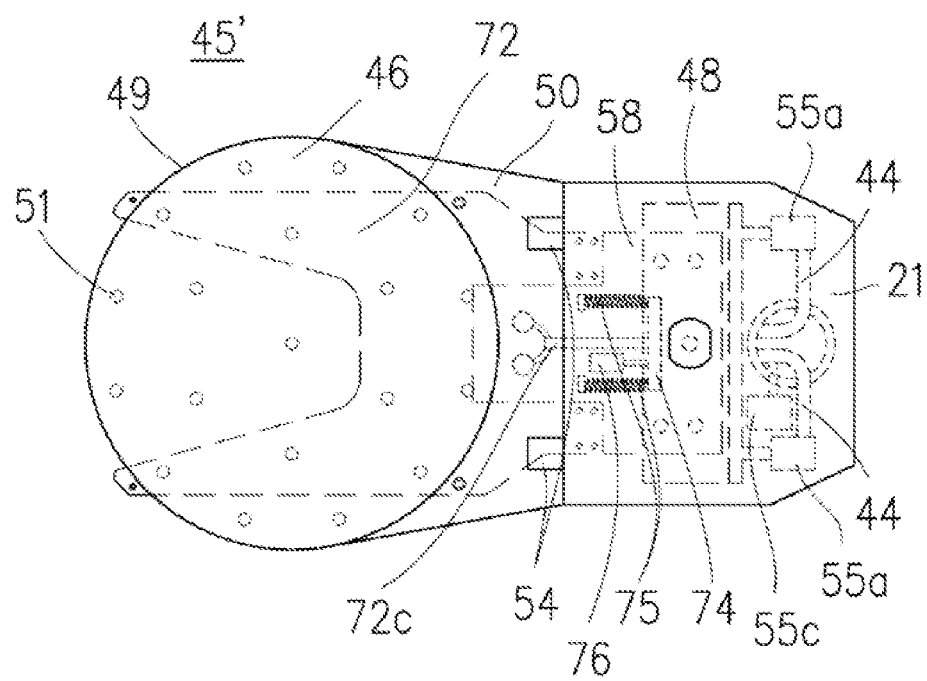
FIG. 13a is a top or a plan view of the holding device 45' of the other embodiment of the present invention.
Figure 13B:
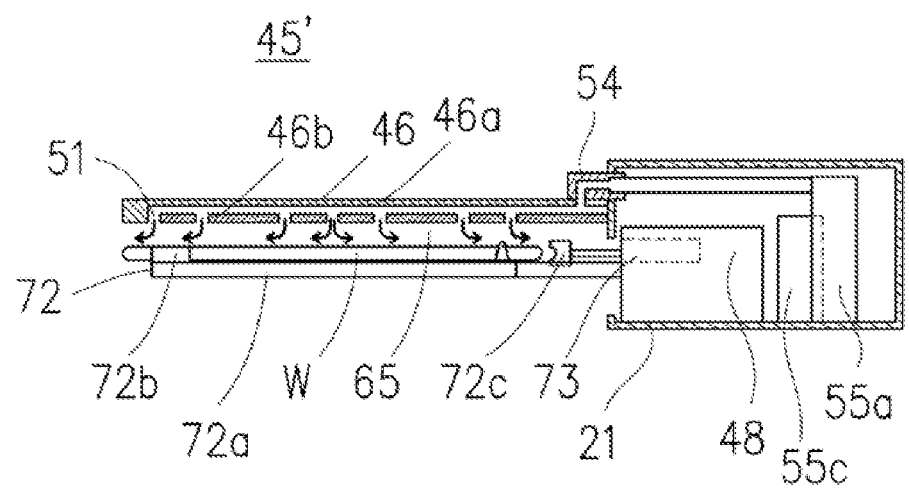

Next, a holding device 45' including a clamp-type holding member 72 according to another embodiment of the present invention will be described. FIG. 13a and FIG. 13b are views showing the holding device 45' of this embodiment, FIG. 13a is a view of the holding device 45' as viewed from the top, and FIG. 13b is a cross-sectional view as viewed from the side. The holding member 72 of the holding device 45' is a member for holding the peripheral edge part of the semiconductor wafer W, and the base end part is fixed to the raising and lowering member 58. The holding member 72 includes a holding member main body 72a, a contact member 72b fixed to a tip end of the holding member main body 72a, a clamp member 72c for holding and releasing the semiconductor wafer W by moving back and forth relative to the semiconductor wafer W, and a reciprocating mechanism 73 for moving the clamp member 72c back and forth. The reciprocating mechanism 73 includes a reciprocating plate 74 to which the end portion of the clamp member 72c is fixed, an urging member 75 for urging the reciprocating plate 74 in a direction of clamping the semiconductor wafer W, and an air cylinder 76 for moving the reciprocating plate 74 in a direction for separating from the semiconductor wafer W. The urging member 75 of the present embodiment is a compression spring, one end is fixed to the raising and lowering mechanism 58', and the other end is fixed to the reciprocating plate 74. Besides, in FIG. 13a, in order to avoid complication of the figure, the flow path 52 formed in the purge plate 46 is omitted.

The air cylinder 76 and a supply source of compressed air are communicated with each other through a tube, and an electromagnetic valve 55c for switching between supply and cutoff of compressed air is provided on the way. The electromagnetic valve 55c is electrically connected to the control unit 30, and the control unit 30 controls the reciprocating motion of the piston rod of the air cylinder 76 by switching on/off of the electromagnetic valve 55c. The piston rod of the air cylinder 76 is extended by turning on the electromagnetic valve 55c and supplying compressed air of the air cylinder 76 to move the reciprocating plate 74 in a direction away from the semiconductor wafer W. By the extension operation of the piston rod, the clamping of the semiconductor wafer W by the clamp member 72c is released. Further, when the control unit 30 turns off the electromagnetic valve 55c, the supply of compressed air to the air cylinder 76 is stopped, and the piston rod performs a contraction operation. When the piston rod is contracted, the reciprocating plate 74 is urged in the direction in which the semiconductor wafer W is grasped by the urging member 75, and the semiconductor wafer W is grasped by the contact member 72b and the clamp member 72c.

The holding member 72 of the present embodiment holds the periphery of the semiconductor wafer W between the contact member 72b having a V-shaped notch and the clamp member 72c so as to sandwich the periphery of the semiconductor wafer W, and therefore, the holding member 72 can hold the semiconductor wafer W without being brought into contact with the wafer surface or the wafer rear surface which is the surface to be processed of the semiconductor wafer W. According to this, it is possible to prevent a trouble in which fine particles of the reactive gas and dust adhering to the rear surface of the wafer are transferred to the rear surface of the other semiconductor wafer W The two contact members 72b are fixed at a distance from the tip of the holding member main body 72a, and the semiconductor wafer W is held by moving forward in a direction in which the semiconductor wafer W is pressed toward the contact member 72b, and thus, the semiconductor wafer W is always positioned at the same position with respect to the holding member 72. Further, it is possible to normally grasp even a semiconductor wafer W that has been warped by heat treatment or the like by increasing the angle of the V-shaped notch of the contact member 72b and the clamp member 72c. Besides, since the material of the contact member 72b and the clamp member 72c is a member which comes into contact with the peripheral edge of the semiconductor wafer W, it is preferable that a hard synthetic resin material having high abrasion resistance such as PEEK (polyether ether ketone) material, ultra-high molecular weight polyethylene, and abrasion-resistant polyester with little generation of minute dust at the time of contact is used. In addition to the above mentioned holding members 47 and 72, a known holding device such as a holding member in a form for holding the semiconductor wafer W by dropping the semiconductor wafer W into a recess that is provided corresponding to the diameter of the semiconductor wafer W or a holding device for holding the bottom surface of the semiconductor wafer W by using so-called a Bernoulli chuck is also applicable in the present invention.

Next, another embodiment of the inert gas discharge ports 51 and the flow path 52 formed in the purge plate 46 will be explained. The discharge ports 51 cause particles of reactive gas remaining on the surface to be processed of the semiconductor wafer W and moisture in the atmosphere to flow out to the outside of the surface to be processed of the semiconductor wafer W by the flow of an inert gas, and further, a space 65 formed by the lower surface of the purge plate 46 and the surface to be processed of the semiconductor wafer W is filled with the inert gas, thereby effectively preventing the intrusion of the atmosphere from the outside of the space 65. The respective discharge ports 51 may be disposed concentrically from the center of the target semiconductor wafer W, or may be disposed in a regular lattice shape at predetermined intervals on the front and rear and right and left sides. In addition, the diameter of each discharge port 51 may be set to the larger than that of the central part of the semiconductor wafer W, and may be disposed at the peripheral part of the semiconductor water W. Further, in the holding device of the present invention, the separation distance of the holding members 47, 72 with respect to the purge plate 46 can be appropriately adjusted and taught in advance so as to effectively prevent the replacement of the surface to be processed and the prevention of air intrusion from the outside.

Figure 14A:
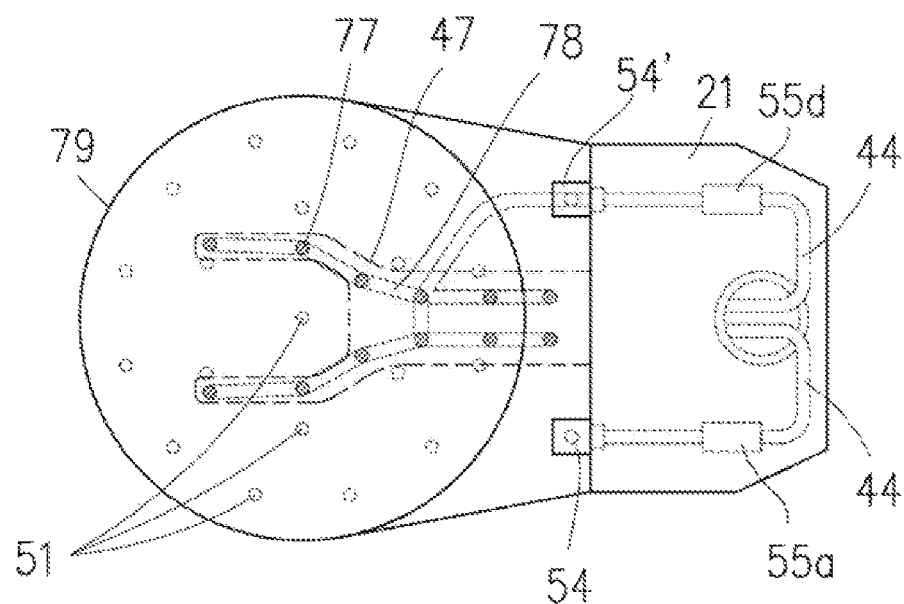
FIG. 14a is a view showing purge plate 79 and FIG. 14b is a view showing purge plate 81 provided in the present invention.
Figure 14B:
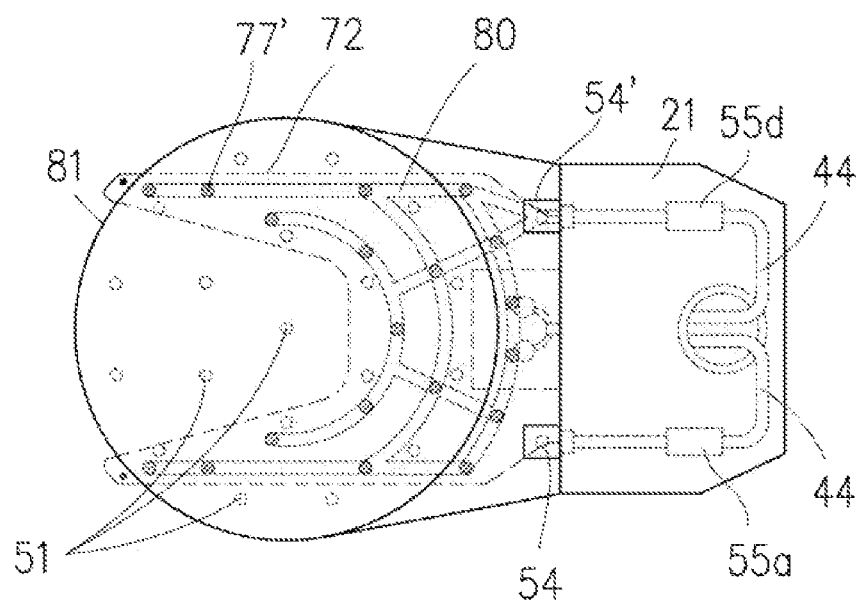

Further, in addition to the discharge ports 51 for supplying an inert gas to the surface to be processed of the semiconductor wafer W, another discharge port 77 for discharging an inert gas toward the holding members 47, 72 for holding the semiconductor wafer W may be provided. FIG. 14a is a view showing a purge plate 79 in which a discharge port 77 and a flow path 78 disposed at positions corresponding to the adsorption-type holding member 47 are added separately from the discharge ports 51, and FIG. 14b is a view showing a purge plate 81 in which a discharge port 77 and a flow path 80 are formed in a position corresponding to the clamp-type holding member 72 separately from the discharge ports 51. In order to avoid confusion, the discharge ports 77, 77 disposed corresponding to the holding members 47, 72 are shown by hatching. In the purge plates 79, 81 of the present embodiment, a discharge port 77 and flow paths 78, 80 for discharging an inert gas toward the holding members 47, 72 are formed separately from the discharging ports 51 for supplying an inert gas to the surface to be processed of the semiconductor wafer W and the inert gas flow path 52. Joint members 54' are attached to positions communicating with the flow paths 78, 80 on the upper surfaces of the purge plates 79, 81, and the piping members 44 for flowing an inert gas are connected to the joint members 54' via the electromagnetic valve 55d. The proximal ends of the piping members 44 are connected to an inert gas supply source (not shown) through the joints 40a. The electromagnetic valve 55d is configured to open and close the valve by control signals transmitted from the control unit 30, and controls discharging and stopping of the inert gas discharged from the purge plates 79, 81 toward the holding members 47, 72, separately from the inert gas supplied to the surface to be processed of the semiconductor wafer W by the signals from the control unit 30.

The discharge of inert gas to the holding members 47, 72 is performed at a timing at which the holding members 47, 72 do not hold the semiconductor wafer W. Further, the discharge ports 77, 77 formed on the purge plates 79, 81 are disposed so that the inert gas is discharged toward the positions where the holding members 47, 72 are in contact with the semiconductor wafer W. Thus, the fine particles of the reaction gas and the dust adhered to the surfaces of the holding members 47, 72 holding the semiconductor wafer W immediately after the processing to the surface to be processed can be removed by the discharge of the inert gas. Therefore, the fine particles and the dust attached to the holding members 47, 72 can be prevented from being transferred to the other semiconductor wafer W. The positions of the holding members 47, 72 when the purge plates 79, 81 discharge the inert gas toward the corresponding holding members 47, 72 are previously taught and stored in the control unit 30.

Figure 15A:
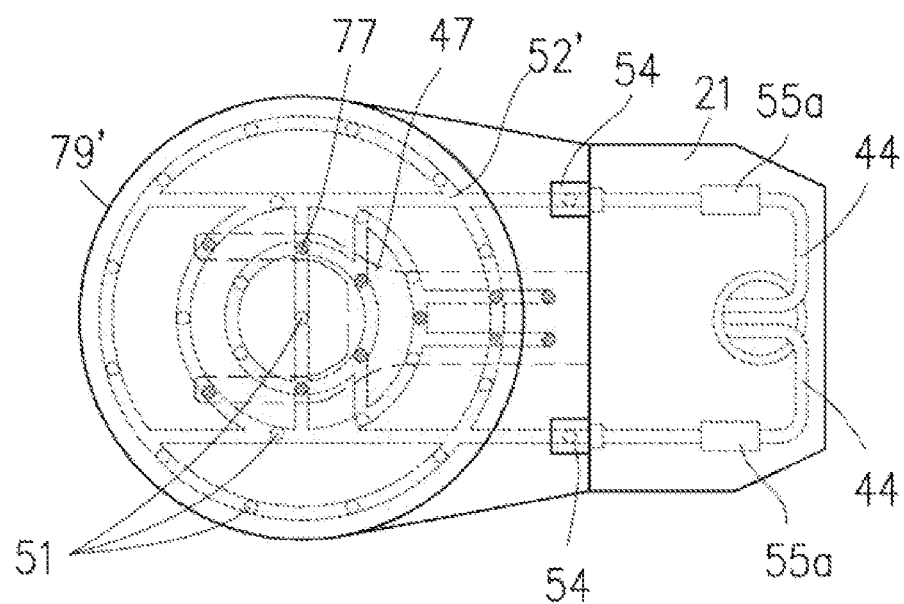
FIG. 15a is a view showing purge plate 79' and FIG. 15b is a view showing purge plate 81' provided in the present invention.
Figure 15B:
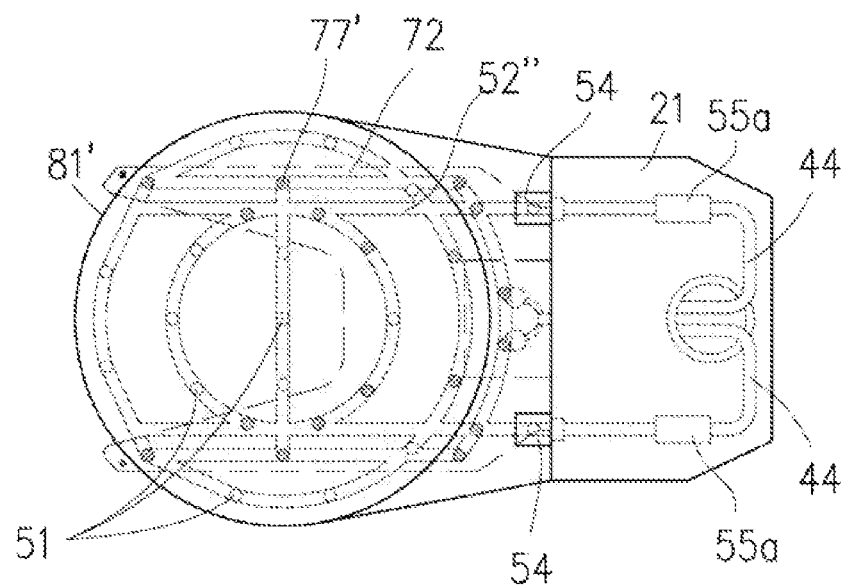

Besides, in the purge plates 79, 81 of the present embodiment, although supply lines for supplying the inert gas to the discharge port 51 for discharging the inert gas to the surface to be processed of the semiconductor wafer W and to the discharge ports 77, 77 for discharging the inert gas to the holding members 47, 72 are separately formed into different systems, it is also possible to integrate these supply lines for supplying the inert gas to the discharge ports 77, 77 and the discharge port 51. This can be achieved by disposing the discharge ports 51 for discharging the inert gas to the surface to be processed of the semiconductor wafer W corresponding to the holding members 47, 72. FIG. 15a shows a purge plate 79' in which a discharge port 77 corresponding to the holding member 47, a discharge port 51 for discharging an inert gas to the semiconductor wafer W, and a flow path 52' for supplying the inert gas to these discharge ports 77, 51 are formed. FIG. 15b shows a purge plate 81' in which a discharge port 77 corresponding to the holding member 72, a discharge port 51, and a flow path 52" for supplying the inert gas to these discharge ports 77, 51 are formed. The flow paths 52', 52" are configured to supply the inert gas to all of the discharge ports 51, 77, 77 formed on the purge plates 79', 81', thereby preventing the internal structure of the purge plates 79', 81' from becoming complicated.

Although the holding devices 45, 45' of the above-described embodiments have the form of the first raising and lowering mechanism in which the purge plate 46 is fixed to the wrist block 21 and the holding members 47, 72 are moved up and down by the raising and lowering mechanisms 48, 66, they may be further made in the form of the second raising and lowering mechanism in which the holding members 47, 72 are fixed to the wrist block 21 and the purge plate 46 is moved up and down by the raising and lowering mechanism 48, 66. In the case of this second raising and lowering mechanism configuration, the raising and lowering operation for holding the semiconductor wafer W with respect to the shelf plate 33 is performed by the operation of the motor M1 of the raising and lowering unit provided in the transport robot 7. Further, the purge plate 46 can be localized at a fixed position in the vertical direction by operating the raising and lowering mechanisms 48, 66 in a direction cancelling the raising and lowering operation of the transport robot 7 in conjunction with the operation of the motor M1.

Figure 16A:
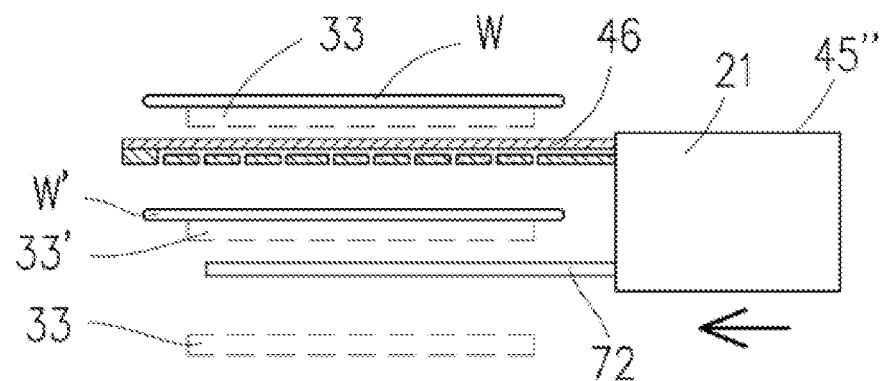
FIG. 16a, FIG. 16b and FIG. 16c are views showing a motion of the holding device 45" of one embodiment of the present invention.
Figure 16B:
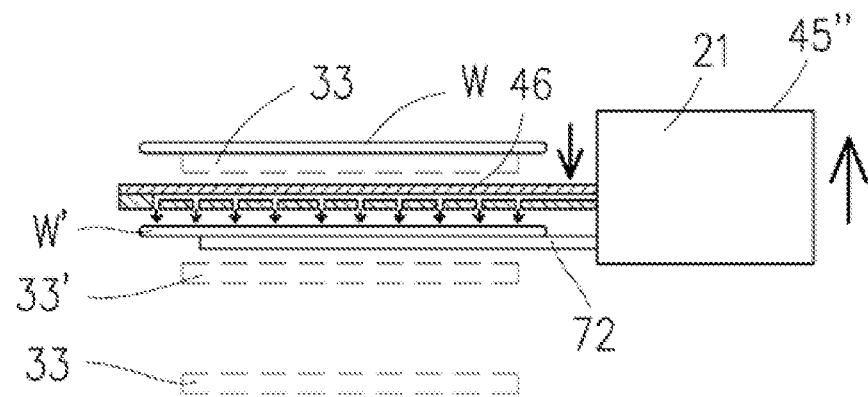
Figure 16C:
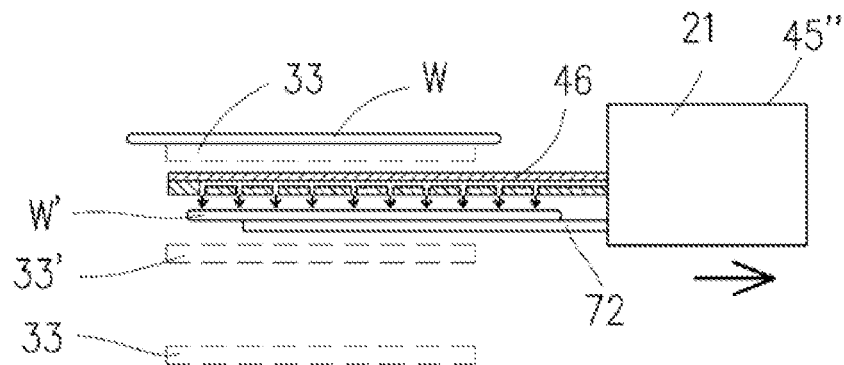
Figure 17A:
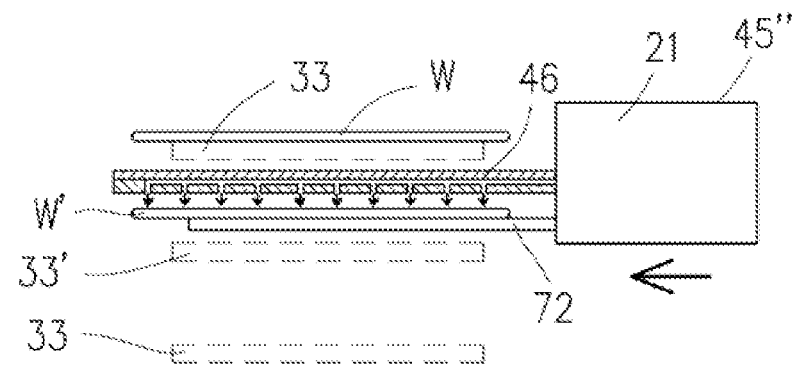
FIG. 17a, FIG. 17b and FIG. 17c are views showing a motion of the holding device 45" of one embodiment of the present invention.
Figure 17B:
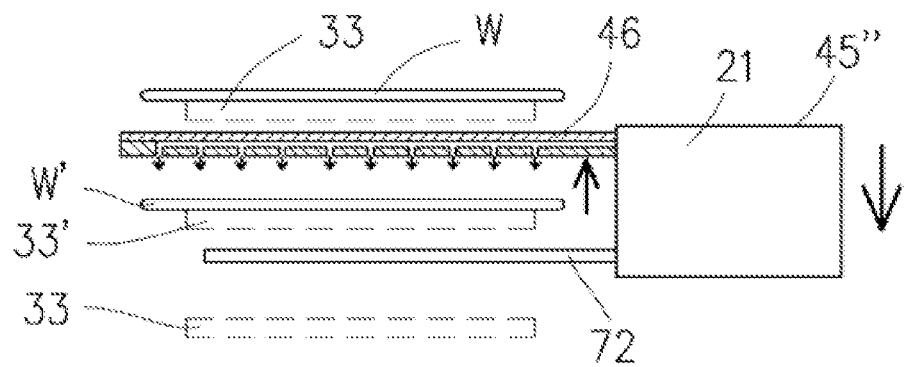
Figure 17C:
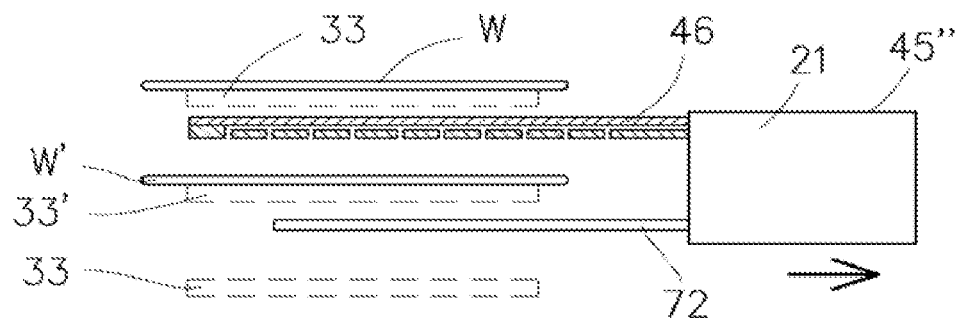

FIG. 16a, FIG. 16b and FIG. 16c are views showing an operation when the holding device 45" of the present embodiment lifts and carries out the semiconductor wafer W' placed on the shelf plate 33' of the carrier 31, and FIG. 17a, FIG. 17b and FIG. 17c are views showing an operation when the semiconductor wafer W' held by the holding device 45" is placed on the shelf plate 33'. Besides, the holding device 45" of the present embodiment will be described as including a holding member 72 for holding the semiconductor wafer W by clamping the semiconductor wafer W. In order to carry out the semiconductor wafer W' from the carrier 31, the control unit 30 first moves the holding device 45" so that the purge plate 46 is positioned at a predetermined position above the semiconductor wafer W' to be carried out and the holding member 72 is positioned at a predetermined position below the semiconductor wafer W'. See FIG. 16a. Next, the control unit 30 causes the motor M1 of the transport robot 7 to operate to upwardly move the arm body 22, the wrist block 21, and the holding member 72 fixed to the wrist block 21, and then to support the semiconductor wafer W' supported by the shelf plate 33' on the holding member 72. Further, in conjunction with the upward movement of the holding member 72, the control unit 30 operates the raising and lowering mechanisms 48, 66 to move the purge plate 46 downward at the same speed as the upward movement speed of the holding member 72. See FIG. 16*b*. By this operation, the purge plate 46 maintains a state of localized at a predetermined position between the shelf plate 33' and the shelf plate 33 directly above the shelf plate 33'. Next, after the semiconductor wafer W' is held by the holding mechanism of the holding member 72, the control unit 30 operates the arm body 22 to move the holding device 45" backward relative to the carrier 31, and then causes the respective drive mechanisms of the transport robot 7 to operate to transport the semiconductor wafer W' to a predetermined transport destination. See FIG. 16*c*. Thus, the operation for carrying out the semiconductor wafer W' from the carrier 31 is completed.

In addition, a procedure for carrying the semiconductor wafer W' held by the holding device 45" into the carrier 31 is carried out in a procedure approximately opposite to the above-described carrying-out procedure. First, the control unit 30 operates each drive mechanism of the transport robot 7 holding the semiconductor wafer W' to move the purge plate 46 and the holding member 72 to a predetermined position taught in advance inside the carrier 31. See FIG. 17*a*. Besides, the predetermined position means that the purge plate 46 and the holding member 72 are located above the shelf plate 33', on which the semiconductor wafer W' is placed, at a predetermined interval, and below the shelf plate 33 located directly above the shelf plate 33' at a predetermined interval, as in the other embodiments. Besides, the inert gas is discharged from the purge plate 46 toward the surface to be processed of the semiconductor wafer W when the transport robot 7 holds the semiconductor wafer W'.

Next, after releasing the clamp of the semiconductor wafer W' by operating the reciprocating mechanism 73 of the holding member 72, the control unit 30 causes the motor M1 to operate to downwardly move the holding device 45" to a predetermined position. In conjunction with the downward movement of the holding member 72, the control unit 30 operates the raising and lowering mechanisms 48, 66 to move the purge plate 46 up at the same speed as the upward movement speed of the holding member 72. See FIG. 17*b*. According to the downward movement of the holding device 45", the semiconductor wafer W' supported by the holding member 72 is transferred to the shelf plate 33'. Further, according to the upward movement of the purge plate 46, the purge plate 46 maintains a state of localized at a predetermined position between the shelf plate 33' and the shelf plate 33 directly above the shelf plate 33'. When the downward movement of the holding device 45" is completed, the control unit 30 operates the arm body 22 to move the holding device 45" backward from the carrier 31 to stop the supply of the inert gas. Next, the control unit 30 moves the semiconductor wafer W' to a predetermined standby position by operating each drive mechanism of the transport robot 7. See FIG. 17*c*. Thus, the carrying-in operation of the semiconductor wafer W' to the carrier 31 is completed.

As described above, the purge plate 46 is configured to be movable up and down by being attached to the raising and lowering mechanisms 48, 66, and the purge plate 46 is moved up and down in a direction for canceling a raising and lowering operation by the raising and lowering mechanism provided in the transport robot 7 in conjunction with the operation of the raising and lowering mechanism of the transport robot 7, whereby the semiconductor wafer W can be placed and lifted in a state in which the purge plate 46 is positioned at a predetermined position. Thus, since the purge plate 46 is configured to be movable up and down, there is no need to move a member having a mechanism part such as the clamp-type holding member 72 up and down, thereby enabling to simplify the structures of the raising and lowering mechanisms 48, 66. Further, the raising and lowering mechanisms 48, 66 do not need to move up and down the weighted object including the holding member 72, which is heavier by the air cylinder 76 or the like, and the semiconductor wafer W, and move up and down only the relatively lightweight purge plate 46, thereby making it possible to reduce the size and weight of the raising and lowering mechanisms 48, 66.

Figure 18A:
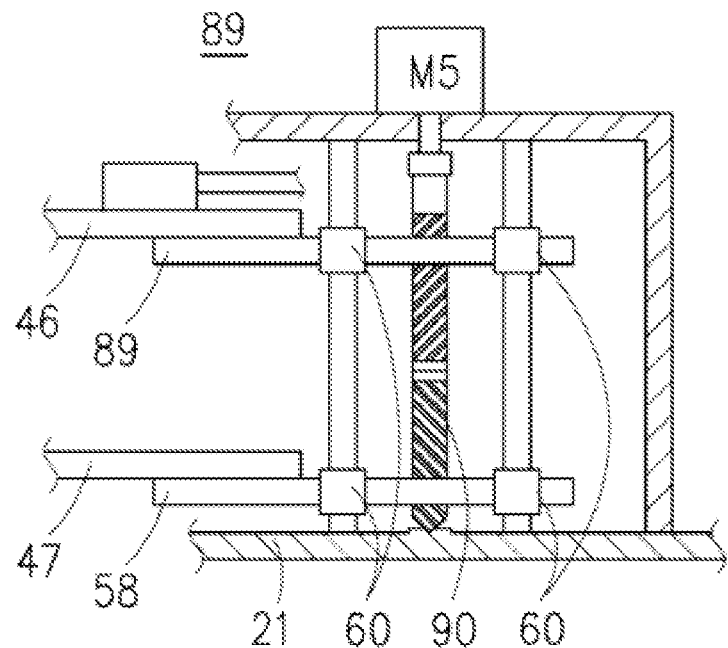
FIG. 18a and FIG. 18b are views showing a raising and lowering mechanism 88 of one embodiment of the present invention.
Figure 18B:
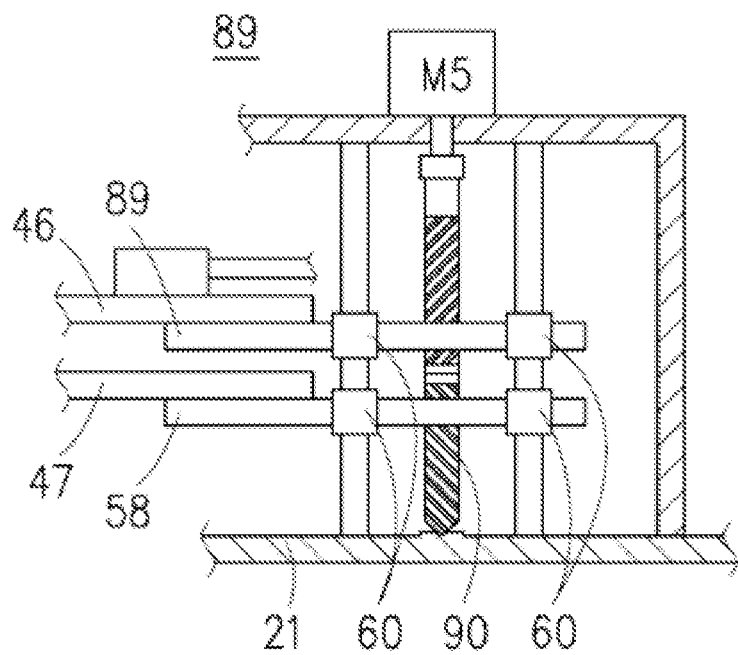

In the above embodiment, one of the purge plate 46 or the holding members 47, 72 is moved up and down by the raising and lowering mechanisms 48, 66, but two raising and lowering mechanisms 48, 66 are provided, and each of the purge plate 46 and the holding members 47, 72 can be moved up and down individually. Further, the purge plate 46 and the holding members 47, 72 can be moved up and down simultaneously by one raising and lowering mechanism 88. FIG. 18*a* and FIG. 18*b* are views showing an operation of the raising and lowering mechanism 88. The raising and lowering mechanism 88 of this embodiment is provided with a feed screw 90 for moving the raising and lowering members 58, 89 in opposite directions, and the raising and lowering members 58, 89 which engage in the respective screw directions are disposed in the feed screw 90. According to this, the raising and lowering members 58, 89 and the holding member 47 and the purge plate 46 fixed to the raising and lowering members 58, 89 are moved in a direction in which they approach each other or in a direction away from each other by the rotation of the drive shaft of the motor M5 clockwise or counterclockwise. Besides, an embodiment with a feed screw 90 is one example, and for example, a known link mechanism or the like can be used. With the above-described configuration, the holding members 47, 72 and the purge plate 46 can be easily accessed, for example, with respect to the carrier 31 having different pitches in the vertical direction of the shelf plate 33.

Figure 19A:
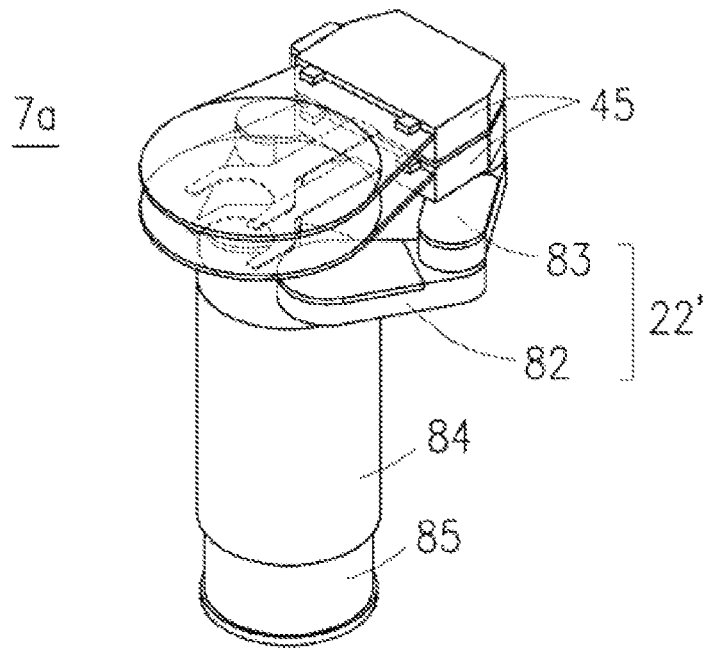
FIG. 19a and FIG. 19b are views showing transport robots 7a, 7b, respectively, of one embodiment of the present invention.
Figure 19B:
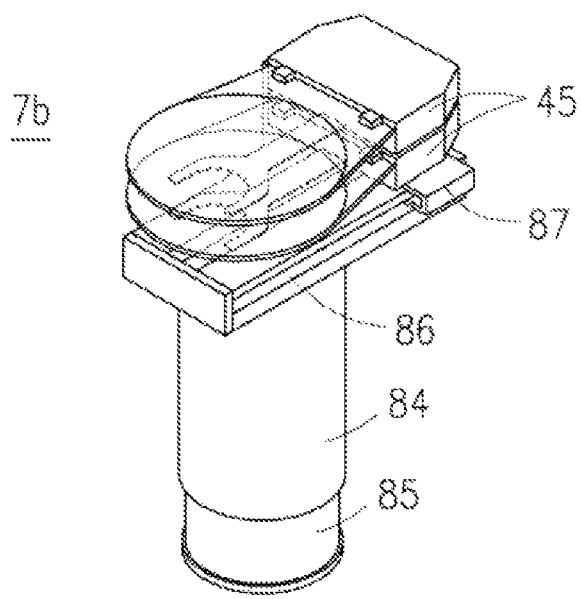

The holding device 45 of the present invention is not limited to a transport robot 7 which is a constitution capable of individually driving each of the arms 26, 29 and the wrist block 21, and can be used by being attached to a transport robot of various forms. For example, it can be used for the transport robot 7*a* as shown in FIG. 19*a*. The transport robot 7*a* is a so-called SCARA type double arm robot. The transport robot 7*a* is provided with two arm bodies 22' consisting of a lower arm 82 and an upper arm 83 so as to be symmetrical to each other, and a holding device 45 according to one embodiment of the present invention is rotatably attached to the tips of the respective arm bodies 22'. Further, the body 84 of the transport robot 7*a* is configured to move up and down and move in a horizontal plane relative to the base 85. The base end of the lower arm 82 is rotatably attached to the body, the base end of the upper arm 83 is rotatably attached to the tip of the lower arm 82, and the holding device 45 is rotatably attached to the tip of the upper arm 83. The lower arm 82, the upper arm 83, and the holding device 45 are connected to each other by a belt (not shown) and a pulley (not shown) at a predetermined rotation ratio, whereby the holding device 45 can be linearly moved back and forth by bending and stretching of the arm body 22'.

Moreover, it can also be used for the transport robot 7*b* having a linear motion slide mechanism 86 as shown in FIG.

19b. The transport robot 7b is composed of the linear motion slide mechanism 86 fixed to the body 84 capable of moving up and down with respect to the base 85 and turning movement in a horizontal plane, and the holding device 45 attached to a bracket 87 fixed to the two movable elements of the linear motion slide mechanism 86 so as to be symmetrically with respect to each other. In these transport robots 7a, 7b, two holding devices 45 are arranged in the same plane with an interval in the vertical direction, so that the respective holding devices 45 can be moved back and forth individually. Besides, the holding devices 45, 45', 45" of the present invention can be used for a transport robot other than the transport robots 7, 7a, 7b.

While the holding devices 45, 45', 45" of the present invention have been described with reference to the embodiments, the scope of the present invention is not limited to this, and various modifications can be made without departing from the scope of the present invention.

DESCRIPTION OF SYMBOLS 1 processing system
2 FOUP
3 processing apparatus
4 EFEM
5 load port
5' load port with replacement function
6 mini environment space
7, 7a, 7b transport robot
8 FFU
9 transport chamber
10 vacuum transport robot
11 processing chamber
12 load lock chamber
13 slit valve
14 gate valve
15 frame
16 wall member
17 fan
18 filter
19, 87 bracket
20 plate
21 wrist block
22, 22' arm body
23 base cover
24, 85 base
25 body
26 the first arm
27 body frame
28 body cover
29 the second arm
30 control unit
31 carrier
32 lid
33, 33' shelf plate
34 hole
35 lock member
36 latch key
37 retainer
38 suction port
38' suction nozzle
39 supply port
39' supply nozzle
40a joint
40b filter
41 stage
42 FIMS door
43 lid opening/closing mechanism
44 piping member
45, 45', 45" holding device
46, 79, 79', 81, 81' purge plate
46a upper member
46b lower member
47, 72 holding member
48, 66, 88 raising and lowering mechanism
49 purge part
50, 55 base
51, 77, 77' discharge port
52, 52', 52", 78, 80 flow path
53, 53a, 53b drive shaft
54, 54' joint member
56 adsorption hole
57 vacuum flow path
58, 58', 89 raising and lowering member
59 linear shaft
60 linear bearing
61, 90 feed screw
62, 69 support member
63a, 63b limit sensor
64 sensor dog
65 space
67, 75 urging member
68 cam member
69a surface
70 cam shaft
71 timing belt
72a holding member body
72b contact member
72c clamp member
73 reciprocating mechanism
74 reciprocating plate
76 air cylinder
82 lower arm
83 upper arm
84 body
86 linear motion slide mechanism
91 purge nozzle
C rotational center axis
M1, M2, M3, M4, M5, M6 motor
W, W' semiconductor wafer

The invention claimed is:

1. A thin plate-shaped substrate holding device, comprising:
a purge plate having formed therein a flow path for flowing an inert gas;
a piping member for connecting an inert gas supply source to the flow path;
discharge ports for communicating with the flow path, provided on a surface facing a surface to be processed of a thin-plate shaped substrate;
a holding member for holding the thin-plate shaped substrate, disposed to a position facing the purge plate; and
a raising and lowering mechanism for moving up and down the holding member with respect to the purge plate,
wherein the purge plate having an upper part and a lower part has an outer dimension that allows it to enter a vertical space of a plurality of shelf plates formed horizontally in a storage container that stores the thin plate-shaped substrate without contacting the thin plate-shaped substrate and the flow path is formed in the upper part of the purge plate and the discharge ports are formed in the lower part of the purge plate, and wherein the holding member and the purge plate are approached or separated from each other through the raising and lowering mechanism.

2. The thin plate-shaped substrate holding device as claimed in claim 1, wherein at least a part of the discharge ports are arranged to a position corresponding to a position where the holding member is disposed.

3. The thin plate-shaped substrate holding device as claimed claim 1, wherein at least a part of the discharge ports are provided inclined outward from a center of the held thin plate-shaped substrate.

4. The thin plate-shaped substrate holding device as claimed in claim 1, wherein the holding member sucks and holds the thin-plate shaped substrate from a lower side.

5. The thin plate-shaped substrate holding device as claimed in claim 1, wherein the holding member clamps peripheral edge of the thin-plate shaped substrate.

6. A thin plate-shaped substrate transport robot, comprising:
   the thin plate-shaped substrate holding device as claimed in claim 1;
   a reciprocating mechanism for moving back and forth the thin plate-shaped substrate holding device;
   a turning mechanism for turning the reciprocating mechanism in a horizontal plane; and
   a raising and lowering mechanism for moving up and down the reciprocating mechanism.

7. A thin plate-shaped substrate transport apparatus, comprising:
   a transport space in which the thin plate-shaped substrate transport robot as claimed in claim 6 is disposed;
   a transport space forming member for forming the transport space;
   a closed container opening/closing apparatus for opening and closing a closed container, being fixed to the transport space forming member, said closed container for containing the thin plate-shaped substrate being placed at a predetermined position; and,
   an FFU for supplying clean air to the transport space as a downflow, fixed on an upper part of the transport space forming member.

8. A thin plate-shaped substrate transport apparatus as claimed in claim 7, wherein the closed container opening/closing apparatus is provided with an atmosphere replacer capable of substituting inside of the closed container to a predetermined atmosphere.

9. A thin plate-shaped substrate holding device, comprising:
   a purge plate having formed therein a flow path for flowing an inert gas;
   a piping member for connecting an inert gas supply source to the flow path;
   discharge ports for communicating with the flow path, provided on a surface facing a surface to be processed of a thin-plate shaped substrate;
   a holding member for holding the thin-plate shaped substrate, disposed to a position facing the purge plate; and
   a raising and lowering mechanism for moving up and down the purge plate with respect to the holding member,
   wherein the purge plate having an upper part and a lower part has an outer dimension that allows it to enter a vertical space of a plurality of shelf plates formed horizontally in a storage container that stores the thin plate-shaped substrate without contacting the thin plate-shaped substrate and the flow path is formed in the upper part of the purge plate and the discharge ports are formed in the lower part of the purge plate, and
   wherein the holding member and the purge plate are approached or separated from each other through the raising and lowering mechanism.

10. The thin plate-shaped substrate holding device as claimed in claim 9, wherein the holding member clamps peripheral edge of the thin-plate shaped substrate.

11. The thin plate-shaped substrate holding device as claimed in claim 9, wherein at least a part of the discharge ports are arranged to a position corresponding to a position where the holding member is disposed.

12. The thin plate-shaped substrate holding device as claimed in claim 9, wherein the holding member sucks and holds the thin-plate shaped substrate from a lower side.

13. The thin plate-shaped substrate holding device as claimed claim 9, wherein at least a part of the discharge ports are provided inclined outward from a center of the held thin plate-shaped substrate.

14. A thin plate-shaped substrate transport robot, comprising:
   the thin plate-shaped substrate holding device as claimed in claim 9;
   a reciprocating mechanism for moving back and forth the thin plate-shaped substrate holding device;
   a turning mechanism for turning the reciprocating mechanism in a horizontal plane; and
   a raising and lowering mechanism for moving up and down the reciprocating mechanism.

15. The thin plate-shaped substrate transport apparatus, comprising:
   a transport space in which the thin plate-shaped substrate transport robot as claimed in claim 14 is disposed;
   a transport space forming member for forming the transport space;
   a closed container opening/closing apparatus for opening and closing a closed container, being fixed to the transport space forming member,
   said closed container for containing the thin plate-shaped substrate being placed at a predetermined position; and,
   an FFU for supplying clean air to the transport space as a downflow, fixed on an upper part of the transport space forming member.

16. A thin plate-shaped substrate transport apparatus as claimed in claim 15, wherein the closed container opening/closing apparatus is provided with an atmosphere replacer capable of substituting inside of the closed container to a predetermined atmosphere.

17. A thin plate-shaped substrate holding device, comprising:
   a purge plate having formed therein a flow path for flowing an inert gas;
   a piping member for connecting an inert gas supply source to the flow path;
   discharge ports for communicating with the flow path, provided on a surface facing a surface to be processed of a thin-plate shaped substrate;
   a holding member for holding the thin-plate shaped substrate, disposed to a position facing the purge plate; and
   a raising and lowering mechanism for moving up and down the holding member and the purge plate, wherein the purge plate having an upper part and a lower part has an outer dimension that allows it to enter a vertical space of a plurality of shelf plates formed horizontally in a storage container that stores the thin plate-shaped substrate without contacting the thin plate-shaped substrate and the flow path is formed in the upper part of the purge plate and the discharge ports are formed in the lower part of the purge plate, and wherein the holding member and the purge plate are approached or separated from each other through the raising and lowering mechanism.

18. The thin plate-shaped substrate holding device as claimed in claim 17, wherein the holding member sucks and holds the thin-plate shaped substrate from a lower side.

19. The thin plate-shaped substrate holding device as claimed in claim 17, wherein the holding member clamps peripheral edge of the thin-plate shaped substrate.

20. A thin plate-shaped substrate transport robot, comprising:
the thin plate-shaped substrate holding device as claimed in claim 17;
a reciprocating mechanism for moving back and forth the thin plate-shaped substrate holding device;
a turning mechanism for turning the reciprocating mechanism in a horizontal plane; and
a raising and lowering mechanism for moving up and down the reciprocating mechanism.

21. A thin plate-shaped substrate transport apparatus, comprising:
a transport space in which the thin plate-shaped substrate transport robot as claimed in claim 20 is disposed;
a transport space forming member for forming the transport space;
a closed container opening/closing apparatus for opening and closing a closed container, being fixed to the transport space forming member,
said closed container for containing the thin plate-shaped substrate being placed at a predetermined position; and,
an FFU for supplying clean air to the transport space as a downflow, fixed on an upper part of the transport space forming member.

22. A thin plate-shaped substrate transport apparatus as claimed in claim 21, wherein the closed container opening/closing apparatus is provided with an atmosphere replacer capable of substituting inside of the closed container to a predetermined atmosphere.

23. The thin plate-shaped substrate holding device as claimed in claim 17, wherein at least a part of the discharge ports are arranged to a position corresponding to a position where the holding member is disposed.

* * * * *